(12) United States Patent
Hwu et al.

(10) Patent No.: US 11,532,669 B2
(45) Date of Patent: Dec. 20, 2022

(54) MEMORY DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Jenn-Gwo Hwu, Taipei (TW); Tzu-Hao Chiang, New Taipei (TW)

(73) Assignees: TAIWAN SEMICONDUCTOR MANUFACTURING CO., LTD., Hsinchu (TW); NATIONAL TAIWAN UNIVERSITY, Taipei (TW)

(*) Notice: Subject to any disclaimer, the term of this patent is extended or adjusted under 35 U.S.C. 154(b) by 0 days.

(21) Appl. No.: 16/549,970

(22) Filed: Aug. 23, 2019

(65) Prior Publication Data

US 2021/0057488 A1    Feb. 25, 2021

(51) Int. Cl.
*H01L 27/24* (2006.01)
*H01L 45/00* (2006.01)

(52) U.S. Cl.
CPC ...... *H01L 27/2436* (2013.01); *H01L 27/2463* (2013.01); *H01L 45/1233* (2013.01); *H01L 45/146* (2013.01); *H01L 45/16* (2013.01)

(58) Field of Classification Search
CPC ............. H01L 27/2436; H01L 27/2463; H01L 45/1233; H01L 45/146; H01L 45/16; H01L 27/0886; H01L 27/228; H01L 45/10; H01L 45/1206
See application file for complete search history.

(56) References Cited

U.S. PATENT DOCUMENTS

| | | | | |
|---|---|---|---|---|
| 4,794,563 A | * | 12/1988 | Maeda | H01L 27/10808 365/182 |
| 5,719,418 A | * | 2/1998 | Jeng | H01L 27/10808 257/297 |
| 9,564,217 B1 | * | 2/2017 | Zhou | H01L 27/1085 |
| 2005/0098905 A1 | * | 5/2005 | Lee | H01L 27/1087 257/296 |
| 2006/0102951 A1 | * | 5/2006 | Lee | H01L 27/115 257/317 |
| 2008/0224228 A1 | * | 9/2008 | Teo | H01L 27/10805 257/379 |
| 2012/0326119 A1 | * | 12/2012 | Ju | H05B 33/14 257/13 |

(Continued)

OTHER PUBLICATIONS

Chun et al., "A 3T Gain Cell Embedded DRAM Utilizing Preferential Boosting for High Density and Low Power On-Die Caches" IEEE Journal of Solid-State Circuits, vol. 46, No. 6, Jun. 2011.

(Continued)

*Primary Examiner* — Su C Kim
(74) *Attorney, Agent, or Firm* — Maschoff Brennan

(57) ABSTRACT

A memory device includes a transistor and a memory cell. The memory cell includes a bottom electrode, a top electrode, and a dielectric structure. The top electrode is electrically connected to the transistor. The dielectric structure includes a thin portion and a thick portion. The thin portion is sandwiched between the bottom electrode and the top electrode. The thick portion is thicker than the thin portion and between the bottom electrode and the top electrode.

20 Claims, 41 Drawing Sheets

(56) References Cited

U.S. PATENT DOCUMENTS

2017/0358577 A1* 12/2017 Lin ..................... H01L 27/0886
2018/0138183 A1* 5/2018 Lin ......................... H01L 45/06
2018/0166630 A1* 6/2018 Tada ................... H01L 45/1253

OTHER PUBLICATIONS

Chun et al., "A 667 MHz Logic-Compatible Embedded DRAM Featuring an Asymmetric 2T Gain Cell for High Speed On-Die Caches" IEEE Journal of Solid-State Circuits, vol. 47, No. 2, Feb. 2012.
Chun et al.,"A 700MHz 2T1C Embedded DRAM Macro in a Generic Logic Process with No Boosted Supplies" IEEE International Solid-State Circuits Conference, DRAM & HIGH-SPEED , SESSION 28, ISSCC (Feb. 20, 2011).

* cited by examiner

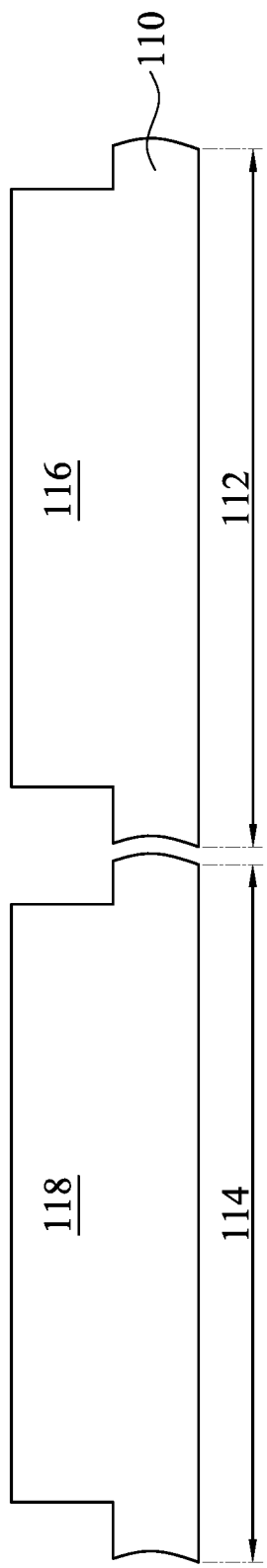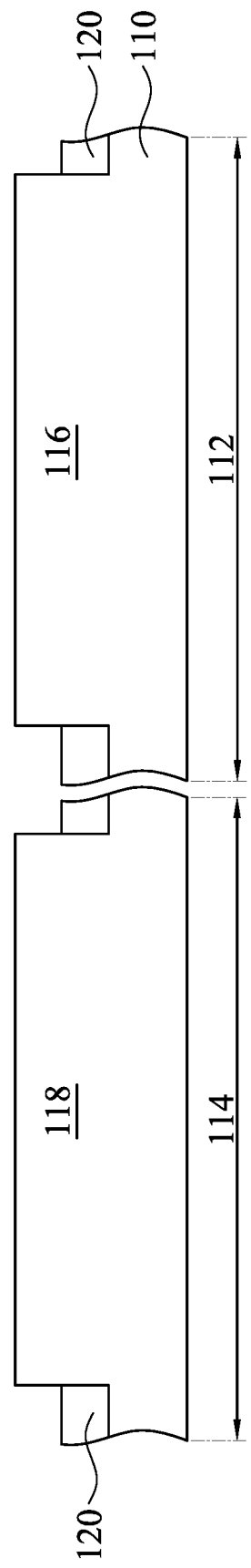

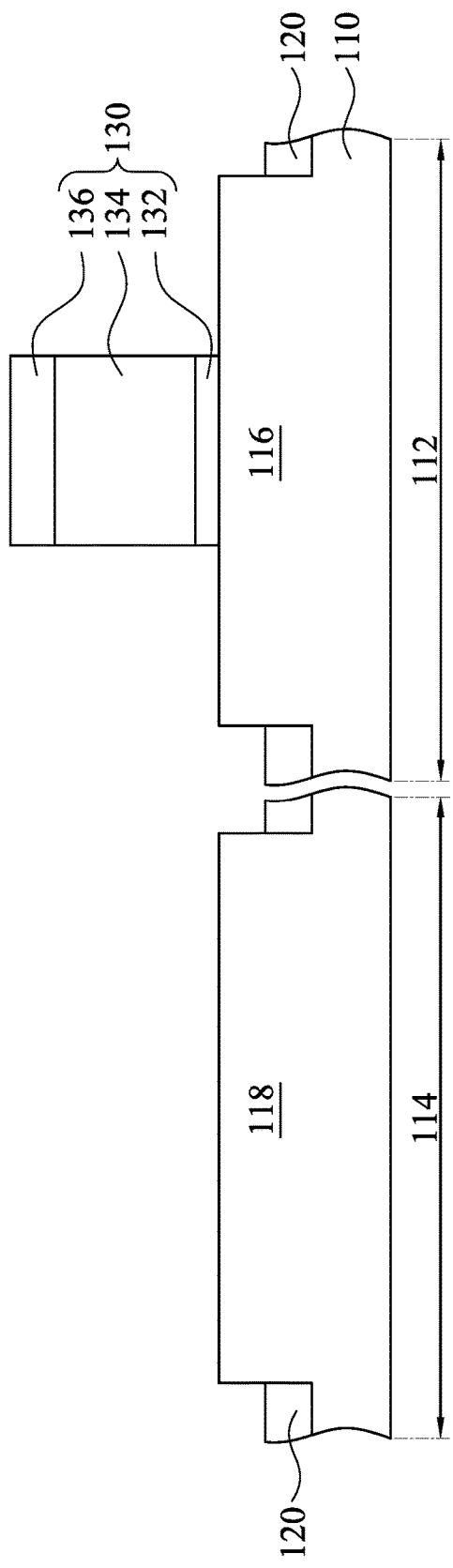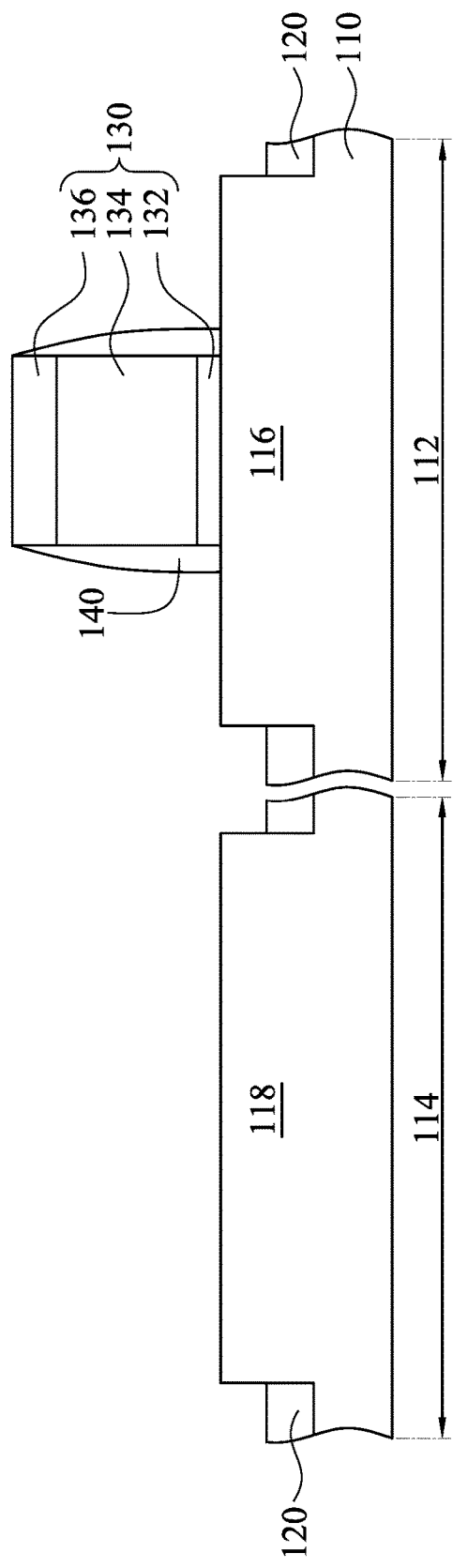

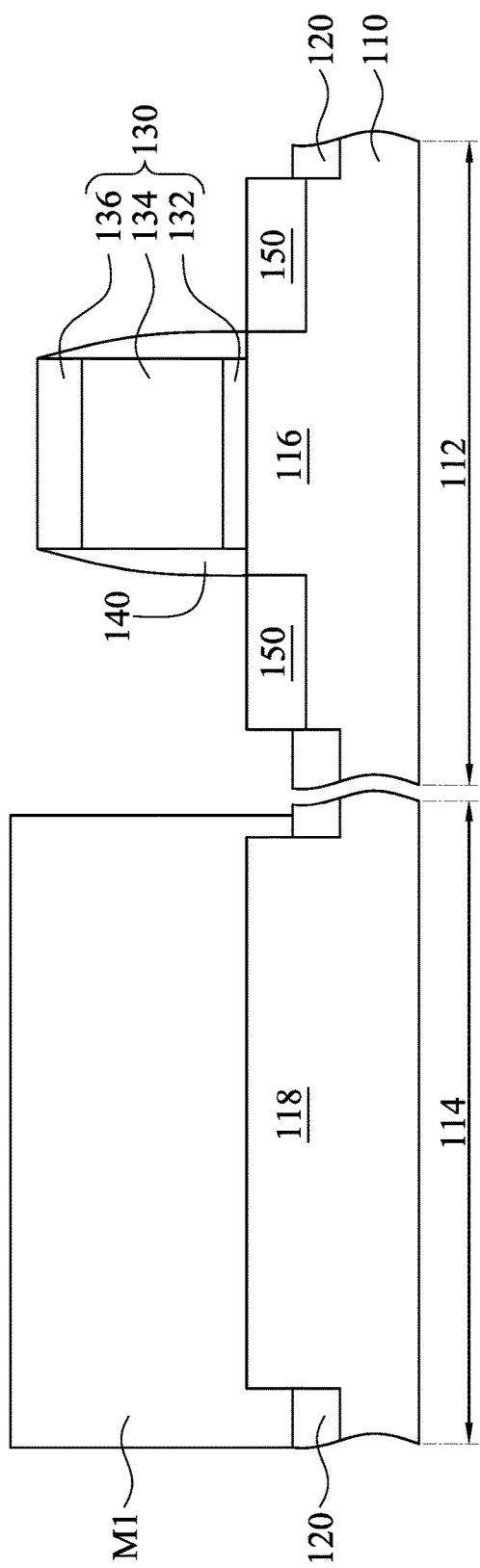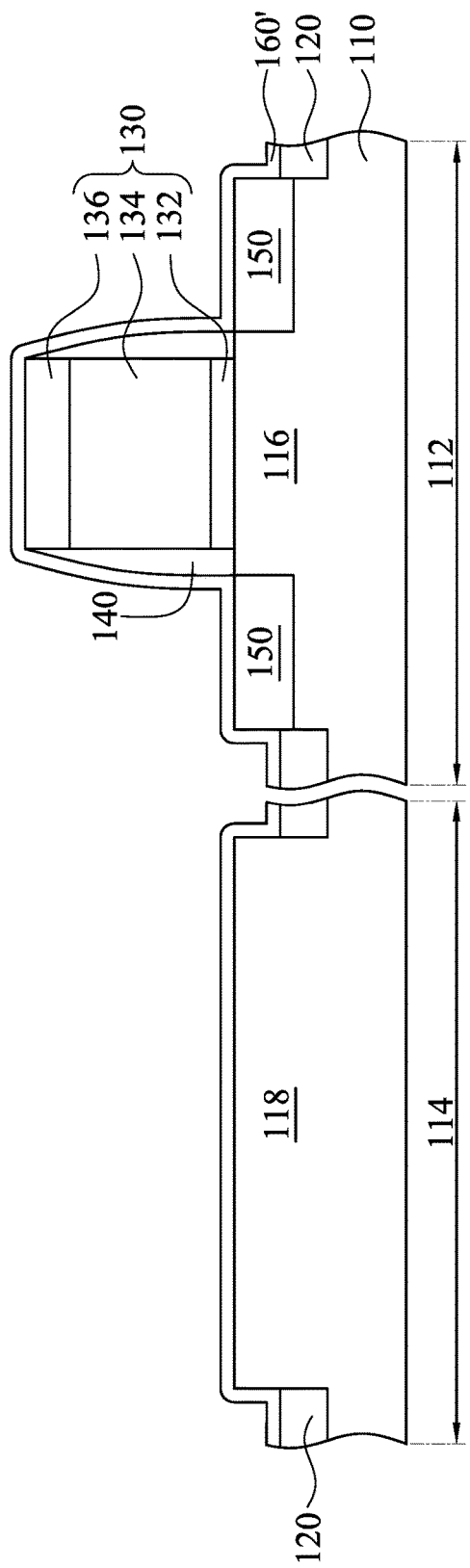

M10B

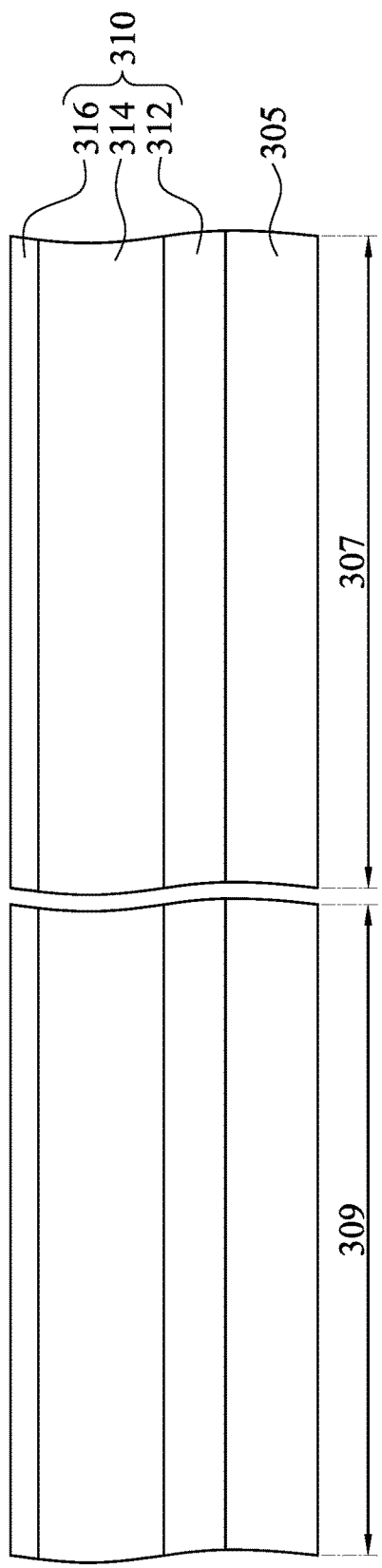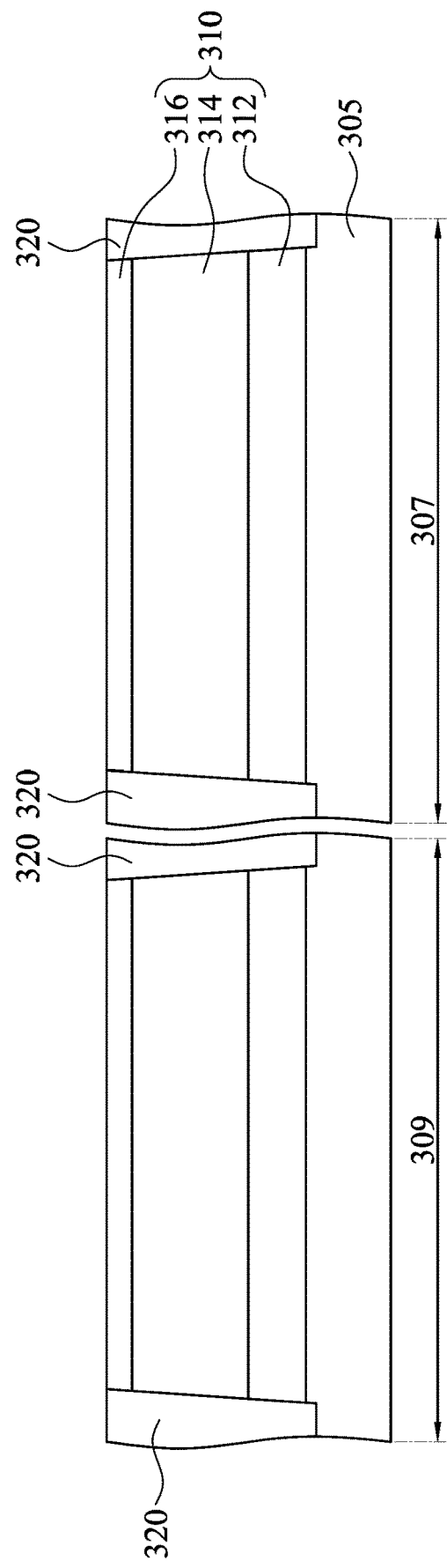

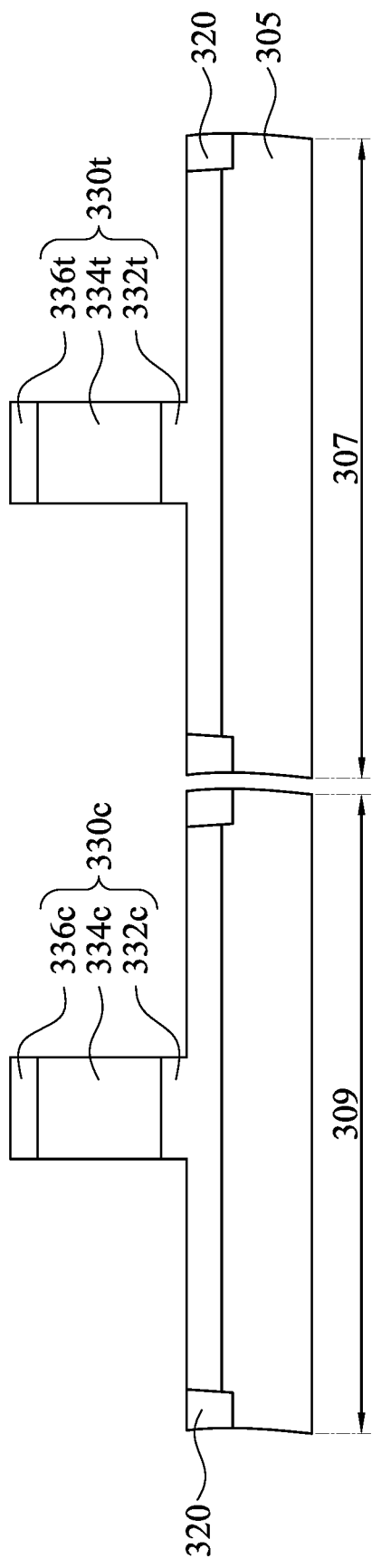
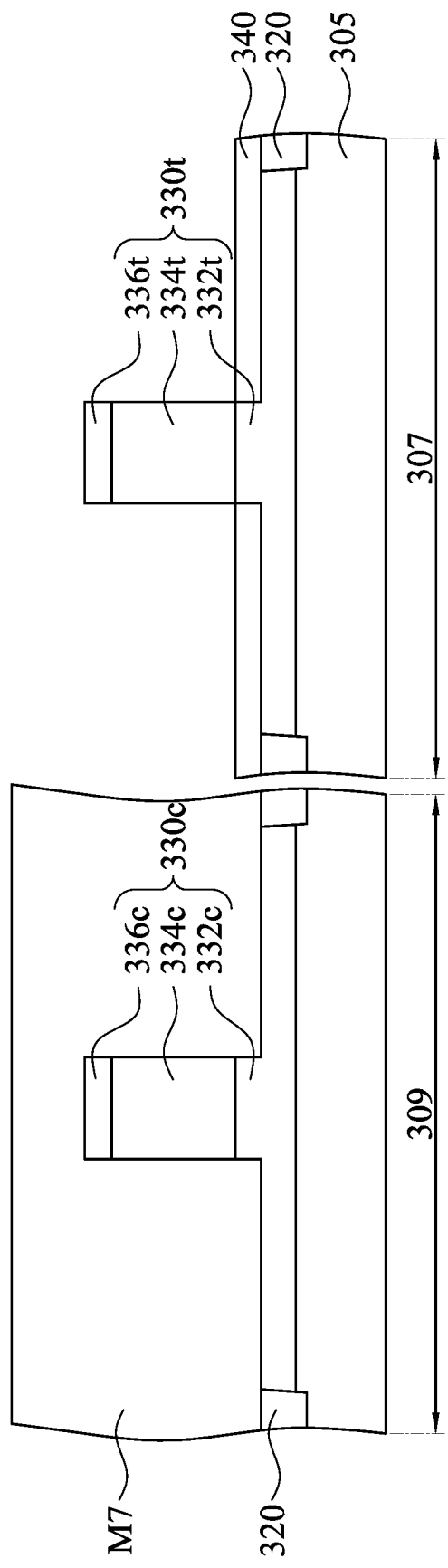

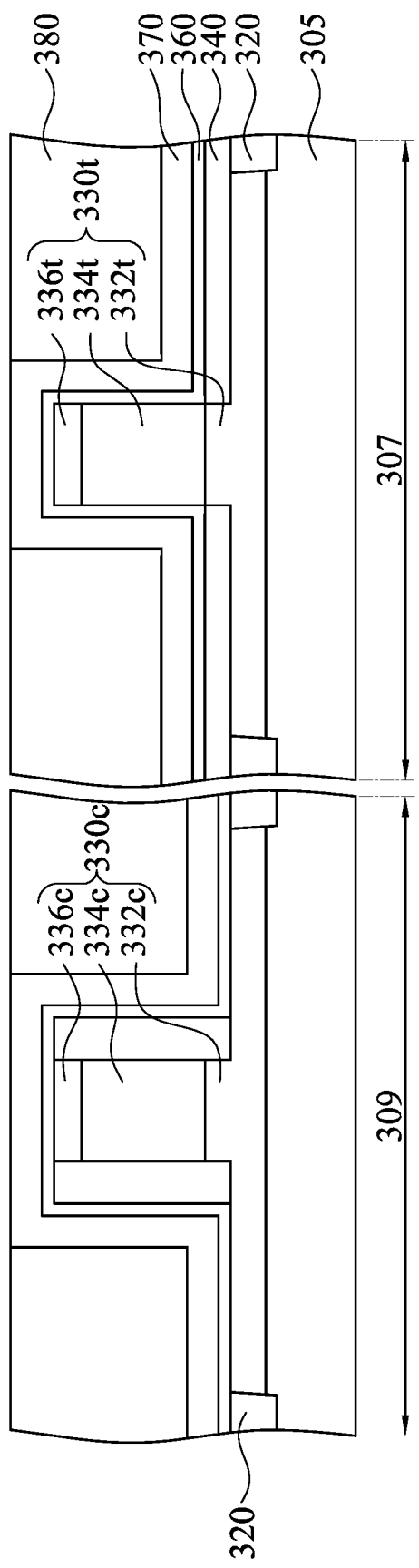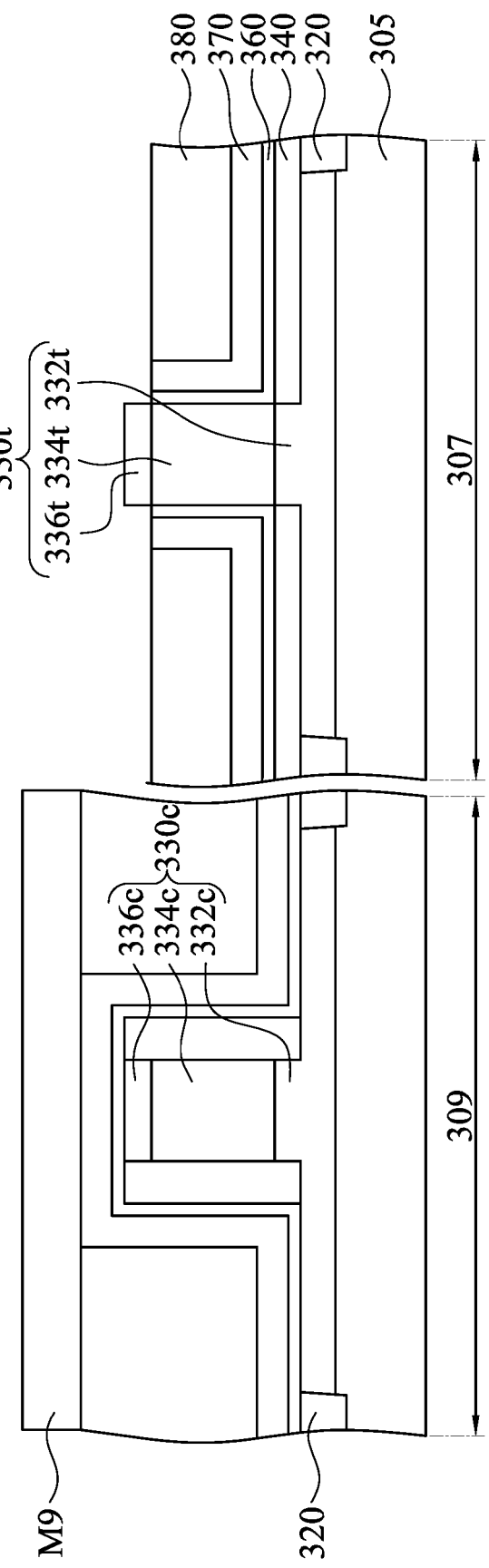
Fig. 12G
Fig. 12H

MEMORY DEVICE AND MANUFACTURING METHOD THEREOF

BACKGROUND

Memory devices are used to store information in semiconductor devices and systems. The popular dynamic random access memory (DRAM) cell includes a switch and a capacitor. DRAMs are highly integrated and fast memory devices, but they do not retain data when power is cut off.

On the other hand, a nonvolatile memory device is capable of retaining data even after power is cut off. Examples of nonvolatile memory devices include the flash memory, magnetic random access memories (MRAMs), resistive random access memories (RRAMs) and phase-change random access memories (PCRAMs). MRAMs store data using variations in the magnetization direction at tunnel junctions. PCRAMs store data using resistance variations caused by phase changes of specific materials. RRAMs store data by changes in electric resistance, not by changes in charge capacity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2M respectively illustrate cross-sectional views of the memory device at various stages in accordance with some embodiments of the present disclosure.

FIGS. 12A to 12L respectively illustrate cross-sectional views of the memory device at various stages in accordance with some embodiments of the present disclosure.

DETAILED DESCRIPTION

Figure 1A:
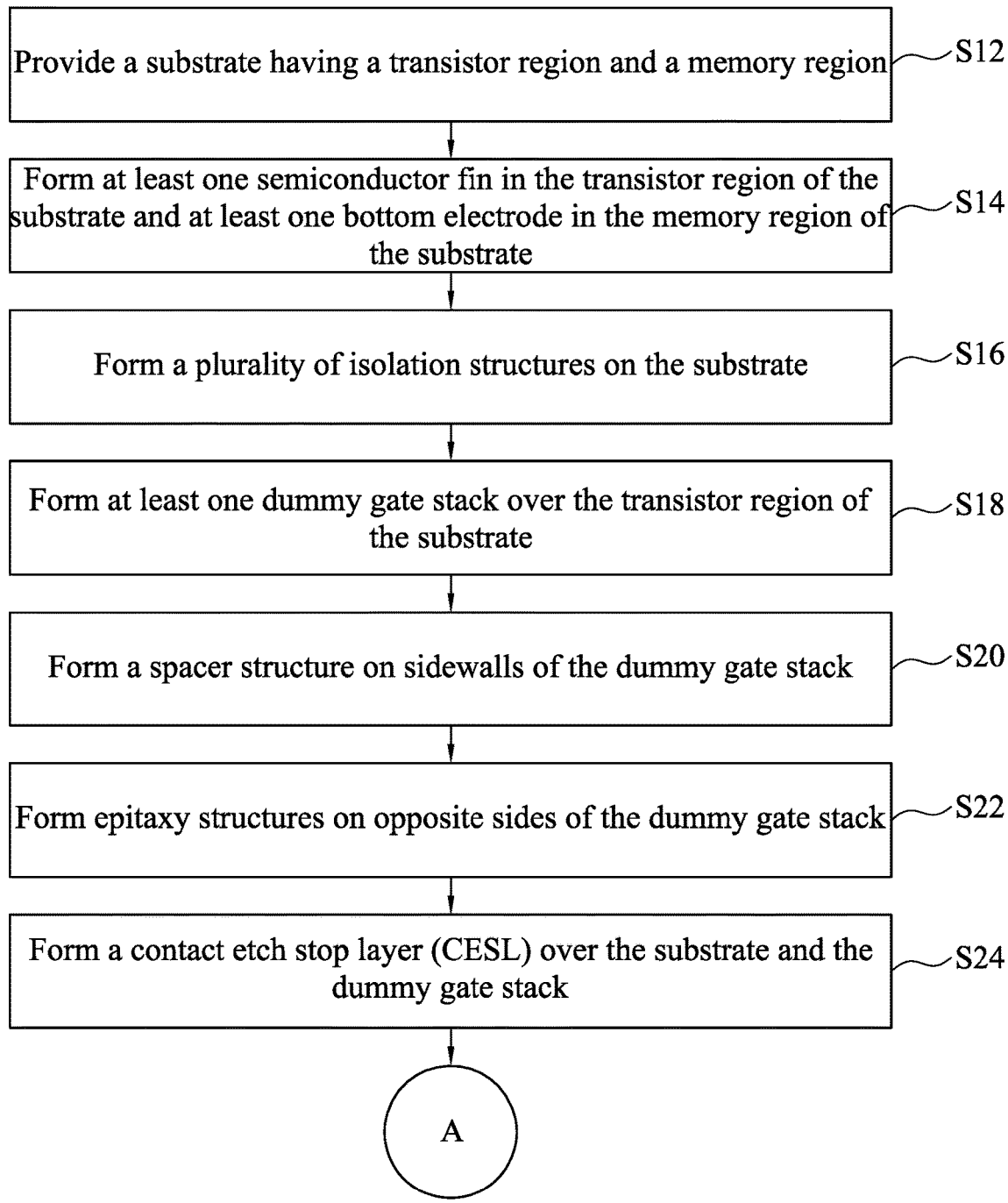
FIGS. 1A and 1B are a flowchart of a method for making a memory device according to aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to integrated memory fabrications and more specifically to one transistor one memory cell formations by forming the memory cell with a different-dielectric-thickness structure. The memory cell stores different states when different voltages are applied. Such structure and its method provide a new type memory device and do not add area burden to the device.

Figure 1B:
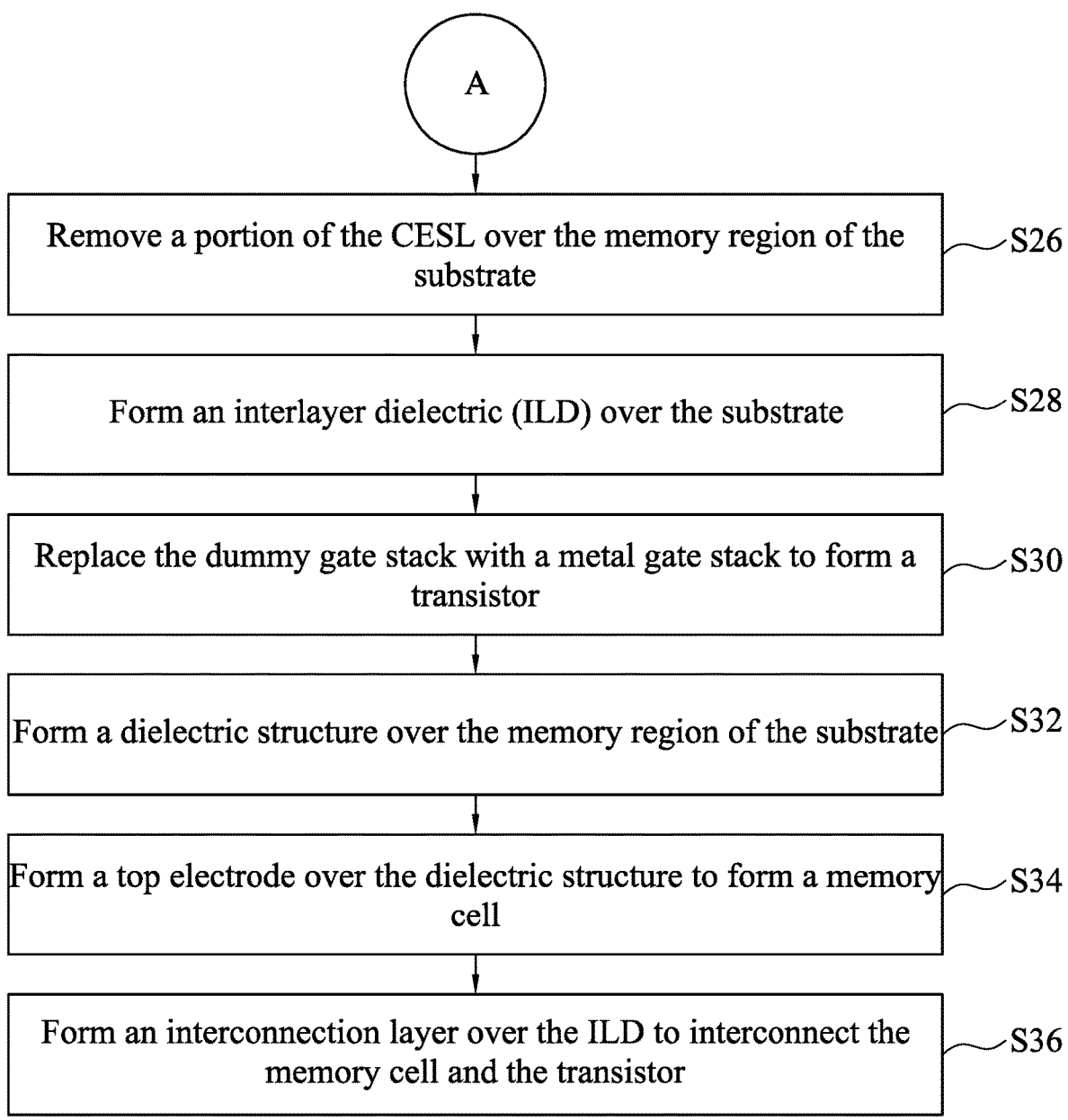
Figure 2G:
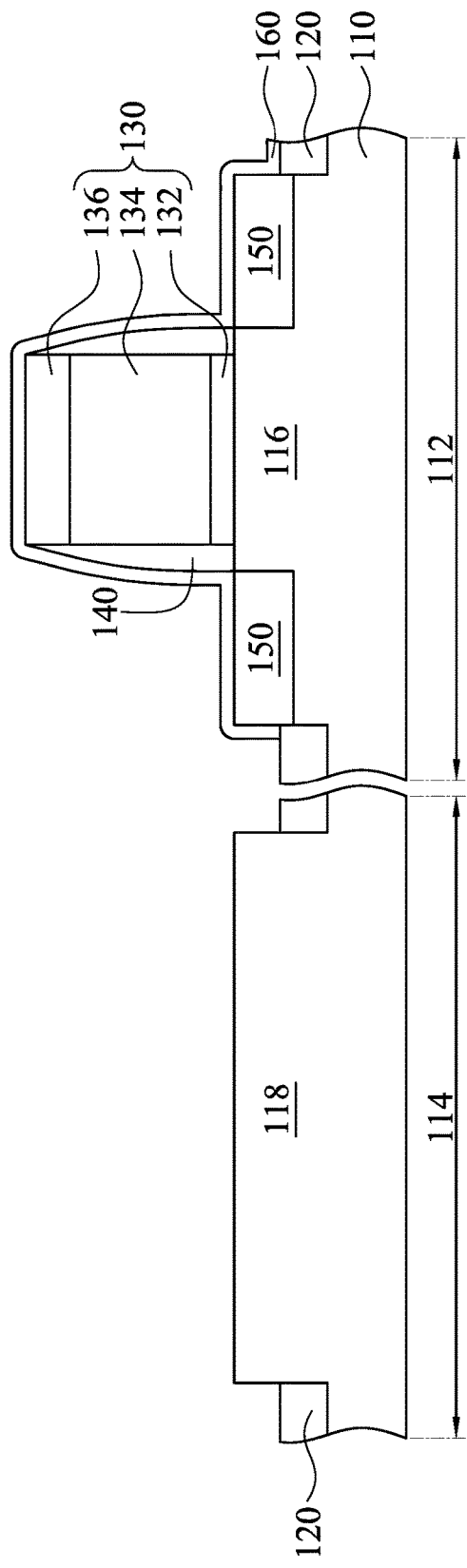

FIGS. 1A and 1B are a flowchart of a method M10A for making a memory device according to aspects of the present disclosure in various embodiments. Various operations of the method M10A are discussed in association with cross-section diagrams FIGS. 2A-2M. Throughout the various views and illustrative embodiments, like reference numbers are used to designate like elements. In operation S12 of method M10A, a substrate 110 is provided, as shown in FIG. 2A. The substrate 110 has a transistor region 112 and a memory region 114. In some embodiments, the substrate 110 may be a semiconductor material and may include a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, GaAs, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

In operation S14 of method M10A, at least one semiconductor fin 116 is formed in the transistor region of the substrate 110 and at least one bottom electrode 118 is formed in the memory region of the substrate 110, as shown in FIG. 2A. In some embodiments, the semiconductor fin 116 and the bottom electrode 118 include silicon. It is note that the number of the semiconductor fin 116 and the bottom electrode 118 in FIG. 2A is illustrative, and should not limit the claimed scope of the present disclosure. For example, in FIG. 2A, the number of the semiconductor fin 116 is one, and the number of the bottom electrode 118 is one. However, in some other embodiments, the numbers of the semiconductor fin 116 and the bottom electrode 118 may both be greater than one.

The semiconductor fin 116 and the bottom electrode 118 may be formed, for example, by patterning and etching the substrate 110 using photolithography techniques. Hence, the semiconductor fin 116 and the bottom electrode 118 are integrally formed. That is, the semiconductor fin 116 and the bottom electrode 118 have the same materials. In some embodiments, a layer of photoresist material (not shown) is deposited over the substrate 110. The layer of photoresist material is irradiated (exposed) in accordance with a desired pattern (the semiconductor fin 116 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In operation S16 of method M10A, a plurality of isolation structures 120 are formed on the substrate 110, as shown in FIG. 2B. The isolation structures 120 may be formed by chemical vapor deposition (CVD) techniques using tetra-ethyl-ortho-silicate (TEOS) and oxygen as a precursor. In some other embodiments, the isolation structures 120 may be formed by implanting ions, such as oxygen, nitrogen, carbon, or the like, into the substrate 110. In yet some other embodiments, the isolation structures 120 are insulator layers of a SOI wafer. At least one of the isolation structures 120 is in contact with the semiconductor fin 116 and the bottom electrode 118.

The isolation structures 120, which act as shallow trench isolations (STIs), are formed both in the transistor region 112 and the memory region 114. The portion of the isolation structures 120 formed in the transistor region 112 surrounds the semiconductor fin 116, and another portion of the isolation structures 120 formed in the memory region 114 surrounds the bottom electrode 118.

In operation S18 of method M10A, at least one dummy gate stack 130 is formed over the transistor region 112 of the substrate 110, as shown in FIG. 2C. The dummy gate stack 130 includes a dummy dielectric layer 132, a dummy gate electrode 134 formed over the dummy dielectric layer 132, and a hard mask layer 136 formed over the dummy gate electrode 134. In some embodiments, a dummy dielectric film and a dummy gate layer (not shown) may be sequentially formed over the substrate 110, and the hard mask layer 136 is formed over the dummy gate layer. The dummy gate layer and the dummy dielectric film are then patterned using the hard mask layer 136 as a mask to form the dummy gate electrode 134 and the dummy dielectric layer 132. As such, the dummy dielectric layer 132, the dummy gate electrode 134 and the hard mask layer 136 are referred to as the dummy gate stack 130. In some embodiments, the dummy dielectric layer 132 may include silicon dioxide, silicon nitride, a high-κ dielectric material or other suitable material. In various examples, the dummy dielectric layer 132 may be deposited by a thermal process, an ALD process, a CVD process, a subatmospheric CVD (SACVD) process, a flowable CVD process, a PVD process, or other suitable process. In some embodiments, the dummy gate electrode 134 may be made of polycrystalline-silicon (poly-Si), polycrystalline silicon-germanium (poly-SiGe), or other suitable materials. The hard mask layer 136 may be made of silicon nitride or other suitable materials.

In operation S20 of method M10A, a spacer structure 140 is formed on sidewalls of the dummy gate stack 130, as shown in FIG. 2D. The spacer structure 140 may include a seal spacer and a main spacer (not shown). The spacer structure 140 includes one or more dielectric materials, such as silicon oxide, silicon nitride, silicon oxynitride, SiCN, $SiC_xO_yN_z$, or combinations thereof. The seal spacers are formed on sidewalls of the dummy gate stack 130 and the main spacers are formed on the seal spacers. The spacer structure 140 may be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structure 140 may include blanket forming spacer layers and then performing etching operations to remove the horizontal portions of the spacer layers. The remaining vertical portions of the spacer layers form the spacer structure 140.

In operation S22 of method M10A, epitaxy structures 150 are formed on opposite sides of the dummy gate stack 130, as shown in FIG. 2E. In some embodiments, a mask M1 may be formed on the memory region 114 of the substrate 110. Then, epitaxy structures 150 are formed on portions of the semiconductor fin 116 uncovered by the dummy gate stack 130, the spacer structure 140, and the mask M1 by performing, for example, a selectively growing process. The epitaxy structures 150 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxy structures 150 have suitable crystallographic orientations (e.g., a (100), (110), or (111) crystallographic orientation). In some embodiments, the epitaxy structures 150 include source/drain epitaxial structures. In some embodiments, where an N-type device is desired, the epitaxy structures 150 may include an epitaxially growing silicon phosphorus (SiP) or silicon carbon (SiC). In some embodiments, where a P-type device is desired, the epitaxy structures 150 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

In operation S24 of method M10A, a contact etch stop layer (CESL) 160' is conformally formed over the substrate 110 and the dummy gate stack 130, as shown in FIG. 2F. Specifically, the mask M1 (see FIG. 2E) is removed before the formation of the CESL 160'. In some embodiments, the CESL 160' may be a stressed layer or layers. In some embodiments, the CESL 160' has a tensile stress and is formed of $Si_3N_4$. In some other embodiments, the CESL 160' includes materials such as oxynitrides. In yet some other embodiments, the CESL 160' may have a composite structure including a plurality of layers, such as a silicon nitride layer overlying a silicon oxide layer. The CESL 160' can be formed using plasma enhanced CVD (PECVD), however, other suitable methods, such as low pressure CVD (LPCVD), atomic layer deposition (ALD), and the like, can also be used.

In operation S26 of method M10A, a portion of the CESL 160' (see FIG. 2F) over the memory region 114 of the substrate 110 is removed, as shown in FIG. 2G. For example, a mask (not shown) may be formed to cover a portion of the CESL 160' over the transistor region 112 of the substrate 110 and expose another portion of the CESL 160' over the memory region 114 of the substrate 110. Then, the CESL 160' is patterned, such that the portion of the CESL layer 160' over the memory region 114 is removed, and the top surface of the bottom electrode 118 is exposed. Then, the mask is removed, and the remaining portion of the CESL is referred to as a CESL 160.

Figure 2H:
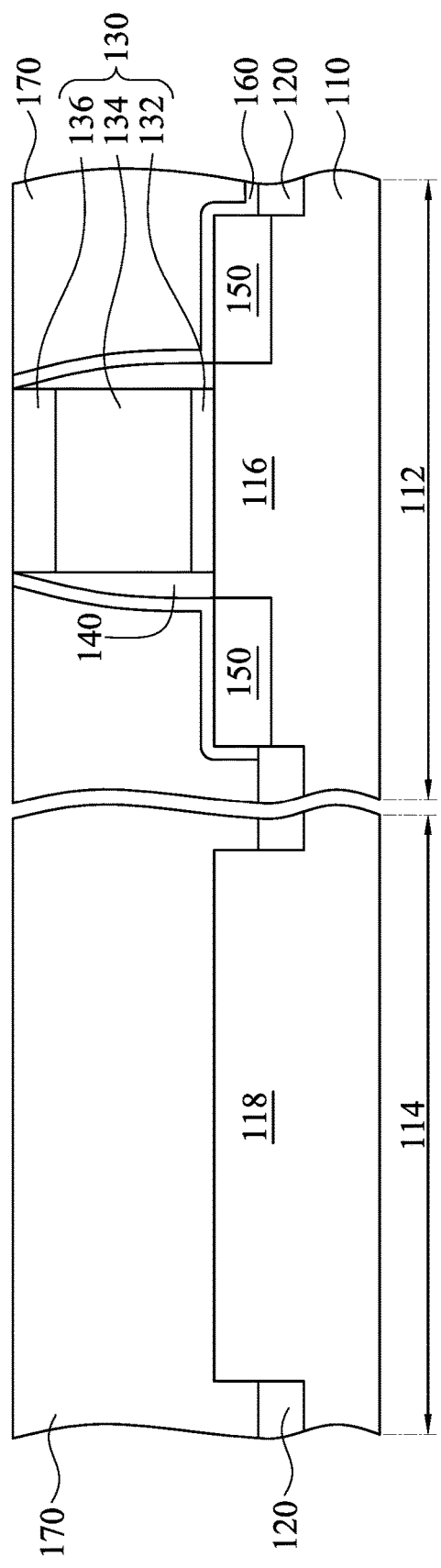

In operation S28 of method M10A, an interlayer dielectric (ILD) 170 is formed over the substrate 110, as shown in FIG. 2H. The ILD 170 covers the CESL 160 and the bottom electrode 118. In some embodiments, the ILD 170 may be formed by depositing a dielectric material over the CESL 160 and then a planarization process is performed to the dielectric material and the CESL 160 to expose the dummy gate stack 130. In some embodiments, the deposition process may be chemical vapor deposition (CVD), high-density plasma CVD, spin-on, sputtering, or other suitable methods. In some embodiments, the ILD 170 includes silicon oxide. In some other embodiments, the ILD 170 may include silicon oxy-nitride, silicon nitride, or a low-k material.

Figure 2I:
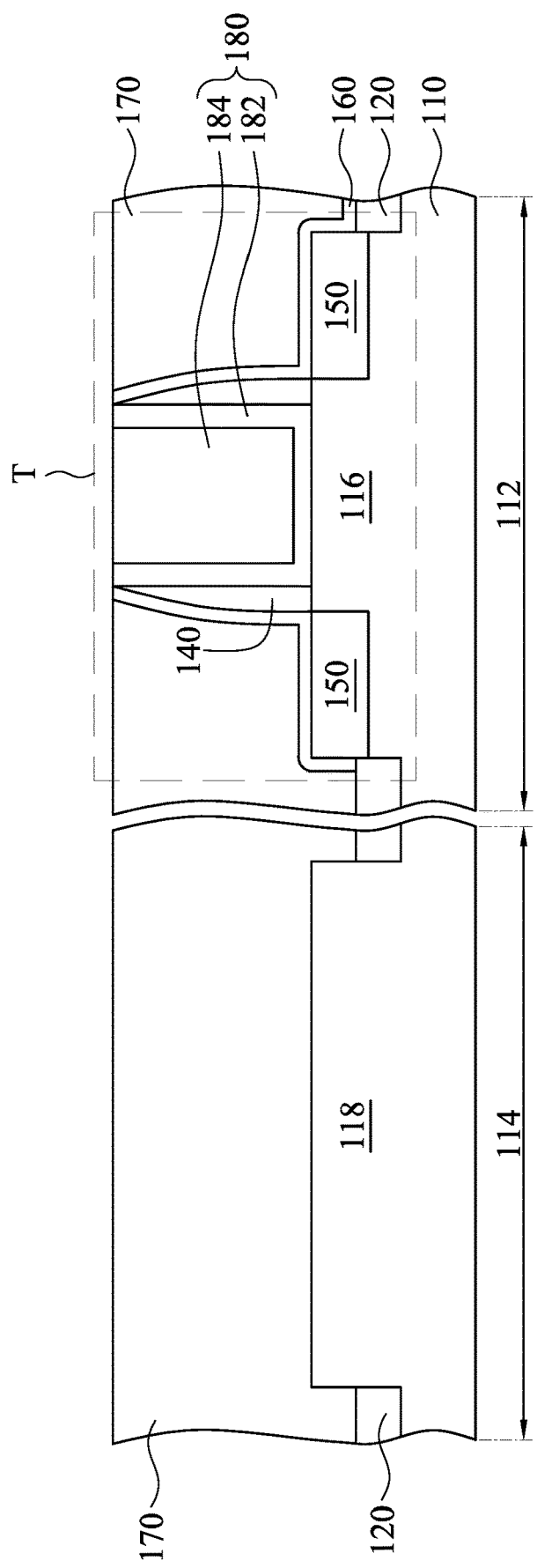

In operation S30 of method M10A, the dummy gate stack 130 (see FIG. 2H) is replaced with a metal gate stack 180, as shown in FIG. 2I. A replacement gate (RPG) process scheme is employed. In the RPG process scheme, a dummy polysilicon gate (the dummy gate electrode 134 (see FIG. 2H) in this case) is formed in advance and is replaced later by a metal gate. In some embodiments, the dummy gate stack 130 is removed to form an opening with the spacer structure 140 as its sidewall. In some other embodiments, the dummy dielectric layer 132 (see FIG. 2H) is removed as well. Alternatively, in some embodiments, the dummy gate electrode 134 is removed while the dummy dielectric layer 132 retains. The dummy gate stack 130 may be removed by dry etch, wet etch, or a combination of dry and wet etch.

A gate dielectric layer 182 is conformally formed in the openings. The gate dielectric layer 182 is over the semiconductor fin 116. The gate dielectric layer 182 can be a high-κ dielectric layer having a dielectric constant (κ) higher than the dielectric constant of $SiO_2$, i.e. κ>3.9. The gate dielectric layer 182 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layer 182 is deposited by suitable techniques, such as ALD, CVD, PVD, thermal oxidation, combinations thereof, or other suitable techniques.

At least one metal layer is formed in the openings and on the gate dielectric layer 182. Subsequently, a chemical mechanical planarization (CMP) process is performed to planarize the metal layer and the gate dielectric layer 182 to form the metal gate stack 180 in the opening. The metal gate stack 180 crosses over the semiconductor fins 116. The metal gate stack 180 includes the gate dielectric layer 182 and a metal gate electrode 184 over the gate dielectric layer 182. The metal gate electrode 184 may include work function metal layer(s), capping layer(s), fill layer(s), and/or other suitable layers that are desirable in a metal gate stack.

The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode 184 is a p-type metal gate including a p-type work function metal layer. In some embodiments, the capping layer in the metal gate electrodes 184 may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer in the metal gate electrodes 184 may include tungsten (W). The fill layer may be deposited by ALD, PVD, CVD, or other suitable process. In FIG. 2I, the semiconductor fin 116, the epitaxy structures 150, and the metal gate stack 180 are referred to as a transistor T.

Figure 2J:
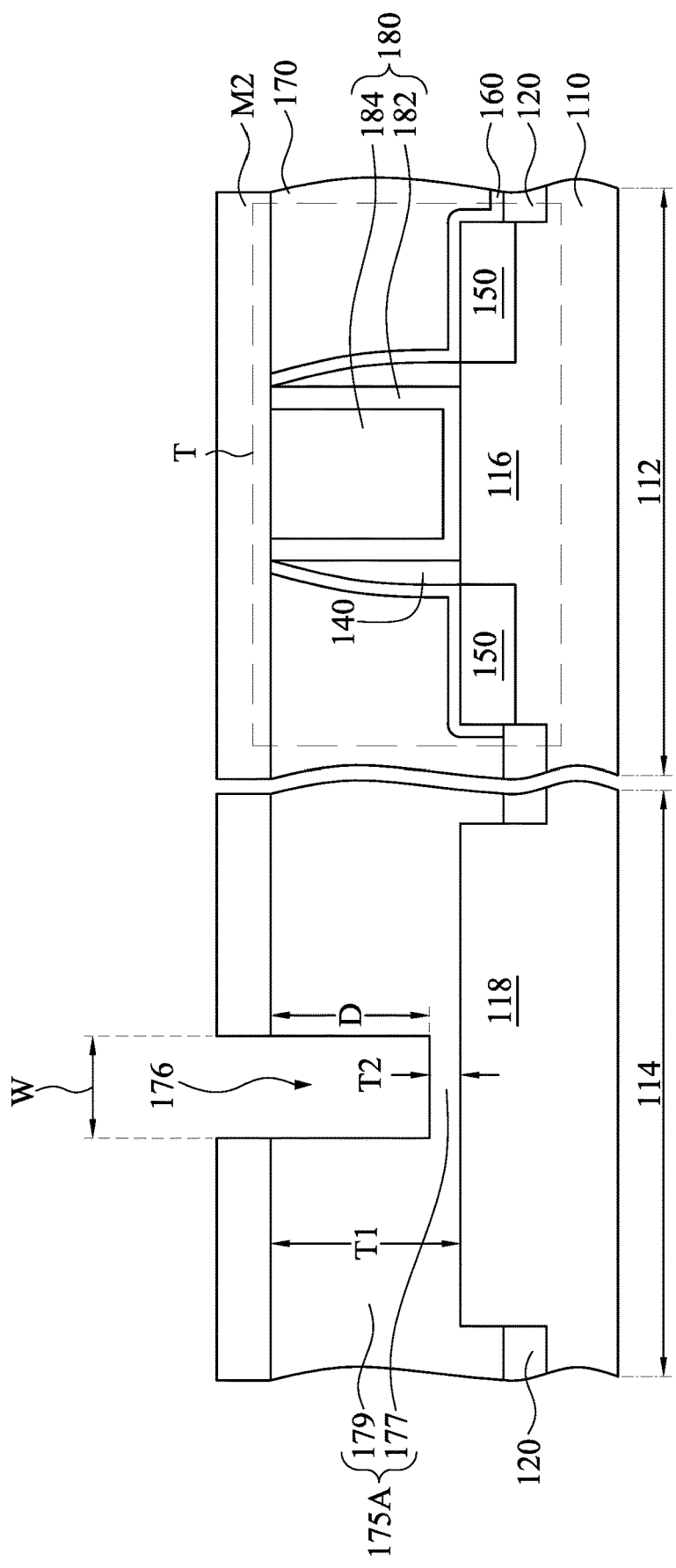

In operation S32 of method M10A, a dielectric structure 175A is formed over the memory region 114 of the substrate 110, as shown in FIG. 2J. In some embodiments, another mask M2 is formed over the ILD 170, and a portion of the ILD 170 over the memory region 114 of the substrate 110 is exposed by the mask M2. Then, the ILD 170 is patterned, and a recess 176 is formed in the portion of the ILD 170 over the memory region 114 of the substrate 110. The recess 176 has a depth D less than the thickness T1 of the ILD 170. That is, the recess 176 does not expose the bottom electrode 118. In some embodiments, the thickness T1 of the ILD 170 is equal to or greater than about 15 nm, such that the formed memory cell C (see FIG. 2K) does not have a current leakage problem.

In FIG. 2J, the dielectric structure 175A includes a thin portion 177 and a thick portion 179. The thin portion 177 has an efficient oxide thickness (EOT) T2 less than the EOT T1 of the thick portion 179. In some embodiments, the EOT T2 of the thin portion 177 is in a range of about 1 nm to about 10 nm. If the EOT T2 is less than about 1 nm, the memory cell C does not have tunneling current, and the two states of the memory cell C may be not distinguishable. If the EOT T2 is greater than about 10 nm, the turn-on voltage of the memory cell may be increased. In some embodiments, a ratio of T2 to T1 is in a range of about 1 to about 30. If the ratio of T2 to T1 is out of this range, the two states ("0" and "1") of the memory device may not be distinguishable. In some embodiments, the width W of the opening 176 is greater than D/5 (where D is the depth of the opening 176) and less than or equal to the width 194w of a top portion 194 of the top electrode 190 (see FIG. 2K). Alternatively, the width W of the opening 176 is in a range of about 0.01 to about 1 times of the width 194w of the top portion 194 of the top electrode 190. If the width W is less than about D/5, the top electrode 190 (see FIG. 2K) may have voids therein. The thin portion 177 is in contact with the bottom electrode 118. In some embodiments, the aspect ratio (D/W) of the opening 176 is less than about 5 for defect-free metal filling.

Figure 2K:
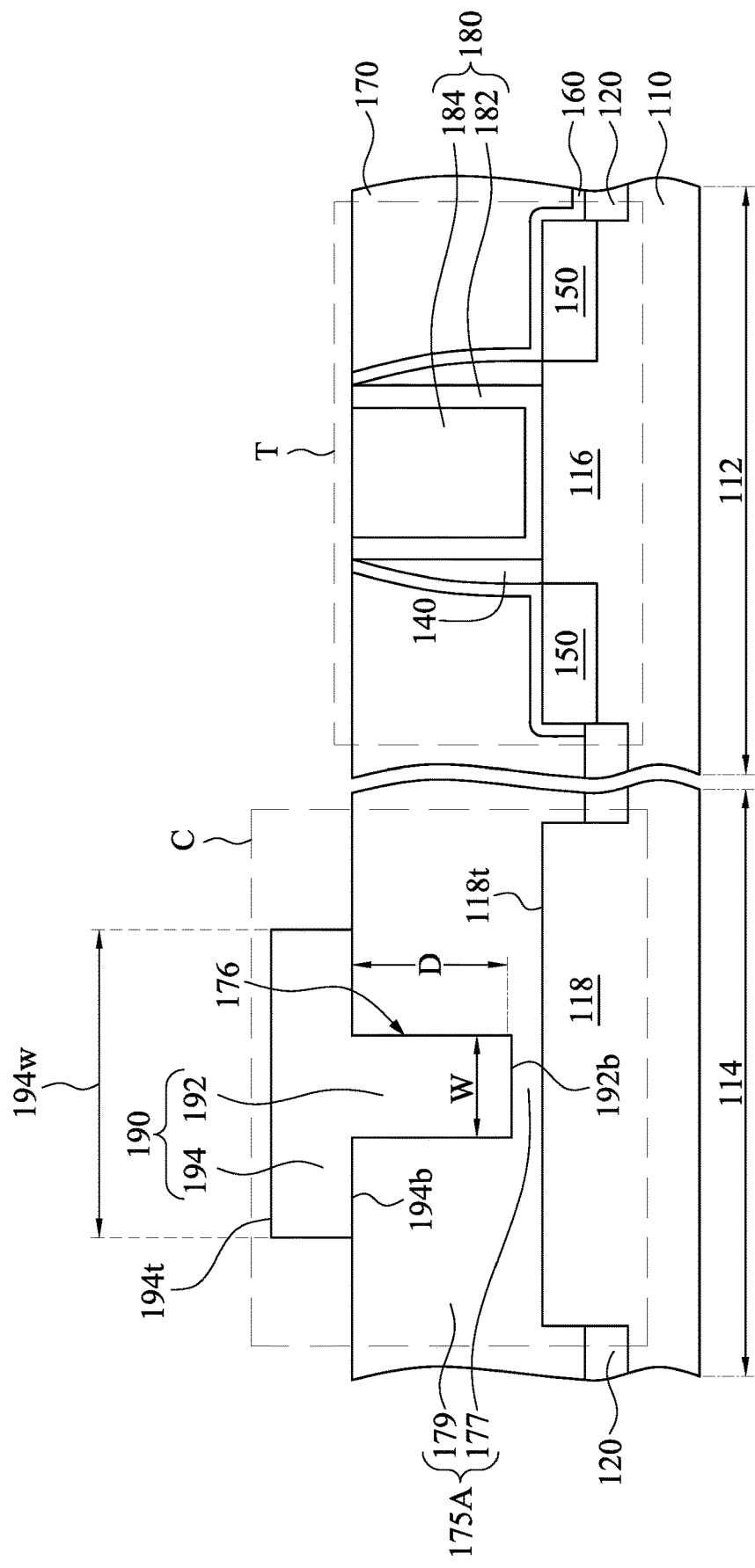

In operation S34 of method M10A, a top electrode 190 is formed over the dielectric structure 175A, as shown in FIG. 2K. In some embodiments, the mask M2 in FIG. 2J is removed, and a conductive material is formed on the ILD 170 and in the opening 176. The conductive material is then patterned to be the top electrode 190. In some embodiments, the top electrode 190 may be made of semiconductor such as polysilicon or metal, such as aluminum, copper, or other suitable materials.

The top electrode 190 includes a bottom portion 192 and a top portion 194 over the bottom portion 192. The bottom portion 192 is in the opening 176, such that the bottom portion 192 inhibits the shape of the opening 176. That is, the bottom portion 192 is surrounded by the thick portion 179 of the dielectric structure 175A and thus has the width W and the depth D. The top portion 194 is over the dielectric structure 175A. The thin portion 177 of the dielectric structure 175A is sandwiched between the bottom electrode 118 and the bottom portion 192 of the top electrode 190. In other words, the thin portion 177 of the dielectric structure 175A is in contact with a bottom surface 192b of the bottom portion 192 of the top electrode 190 and a top surface 118t of the bottom electrode 118. Further, the thick portion 179 of the dielectric structure 175A is in contact with a bottom surface 194b of the top portion 194 of the top electrode 190 and the top surface 118t of the bottom electrode 118. In some embodiments, the top surface 194t of the top portion 194 has a first area, and the bottom surface 192b of the bottom portion 192 has a second area. An area ratio of the second area to the first area is in a range of about 0.001 to about 0.8. In some embodiments, the area ratio is less than about 0.05. If the area ratio is greater than about 0.8, the two states of the memory cell C (see FIG. 2M) may not be distinguished. If the area ratio is less than about 0.001, the (transient) current of the memory cell C may not large enough. The top view of the top portion 194 may be circular, elliptical, rectangular, square, or some other shapes with or without rounded corners. In FIG. 2K, the bottom electrode 118, the top electrode 190, and the dielectric structure 175A are together referred to as a memory cell C.

Figure 2L:
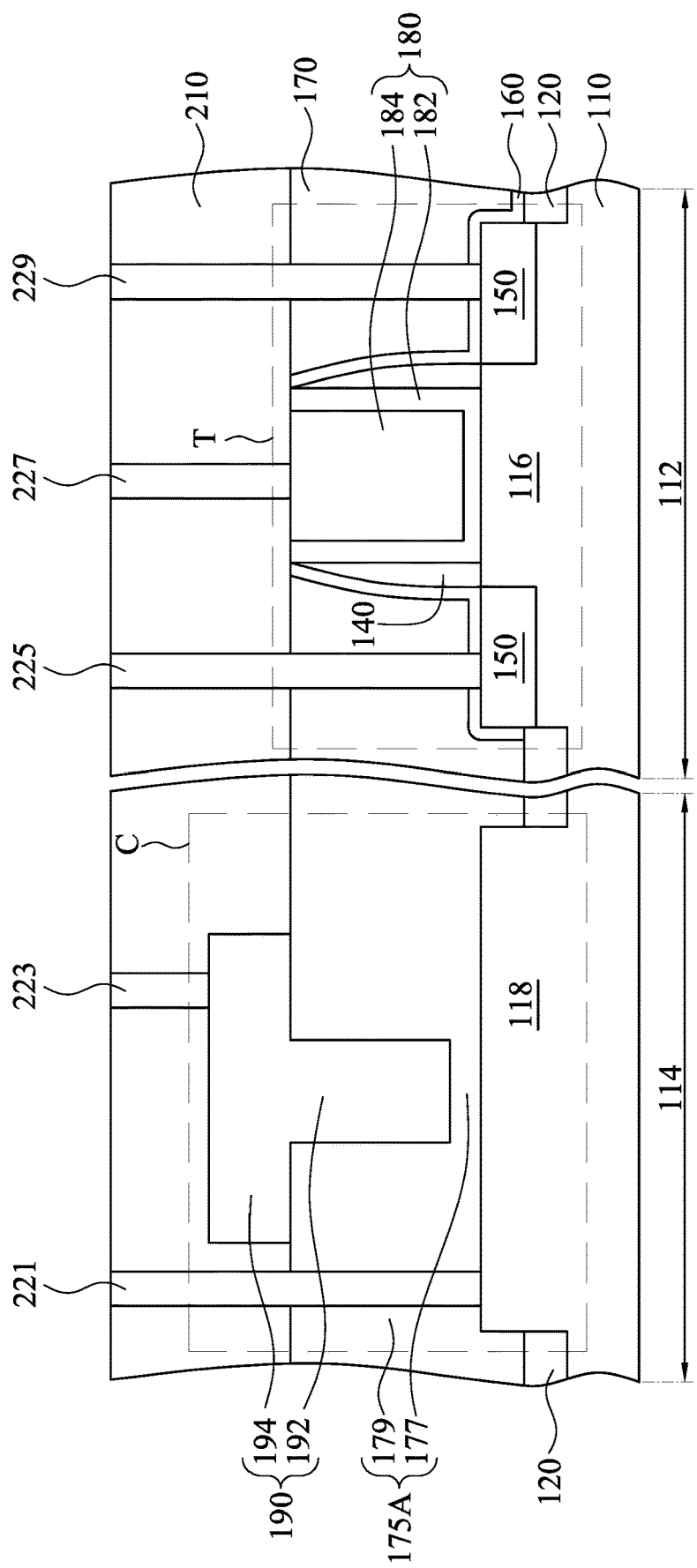
Figure 2M:
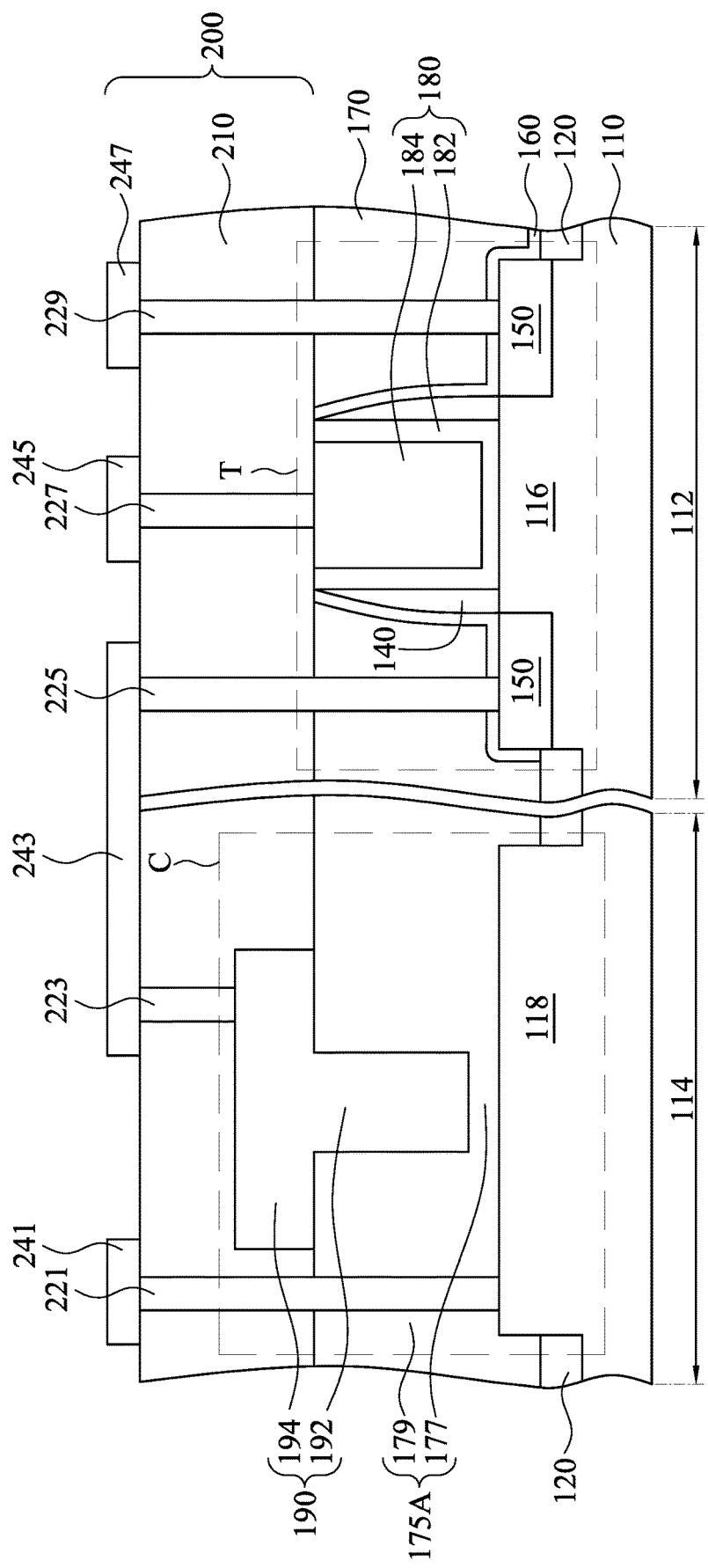

In operation S36 of method M10A, an interconnect layer 200 is formed over the ILD 170 to interconnect the memory cell C and the transistor T, as shown in FIGS. 2L and 2M. Referring to FIG. 2L, a dielectric layer 210 is formed over the transistor T and the memory cell C. In some embodiments, the dielectric layer 210 and the ILD 170 (see FIG. 2H) may have the same or similar material. Then, a plurality of contacts 221, 223, 225, 227, and 229 are formed in the dielectric layer 210. The contact 221 is in contact with the bottom electrode 118 of the memory cell C, the contact 223 is in contact with the top electrode 190 of the memory cell C, the contact 225 is in contact with an epitaxy structure 150 of the transistor T, the contact 227 is in contact with the metal gate stack 180 of the transistor T, and the contact 229 is in contact with another epitaxy structure 150 of the transistor T.

Referring to FIG. 2M, a plurality of conductive lines 241, 243, 245, and 247 are formed on the dielectric layer 210. The conductive line 241 is in contact with the contact 221 and serves as a terminal of the memory cell C. The conductive line 241 may be grounded in some embodiments. The conductive line 243 is in contact with the contacts 223 and 225 to interconnect the top electrode 190 of the memory cell C and the drain of the transistor T. The conductive line 245 is in contact with the contact 227 and serves as a terminal of the transistor T, and the conductive line 245 may be a word line. The conductive line 247 is in contact with the contact 229 and serves as another terminal of the transistor T, and the conductive line 247 may be a bit line.

It is noted that the formation of the interconnect layer 200 in FIGS. 2L and 2M is an example, and should not limit the present disclosure. In some other embodiments, the formation of the interconnect layer 200 includes damascene process. That is, the conductive lines and contacts are formed together. In some other embodiments, the memory cell C may be formed before the metal gate stack 180. That is, the operations S32 and S34 may be performed before the operation S30 in FIGS. 1A and 1B.

Figure 3A:
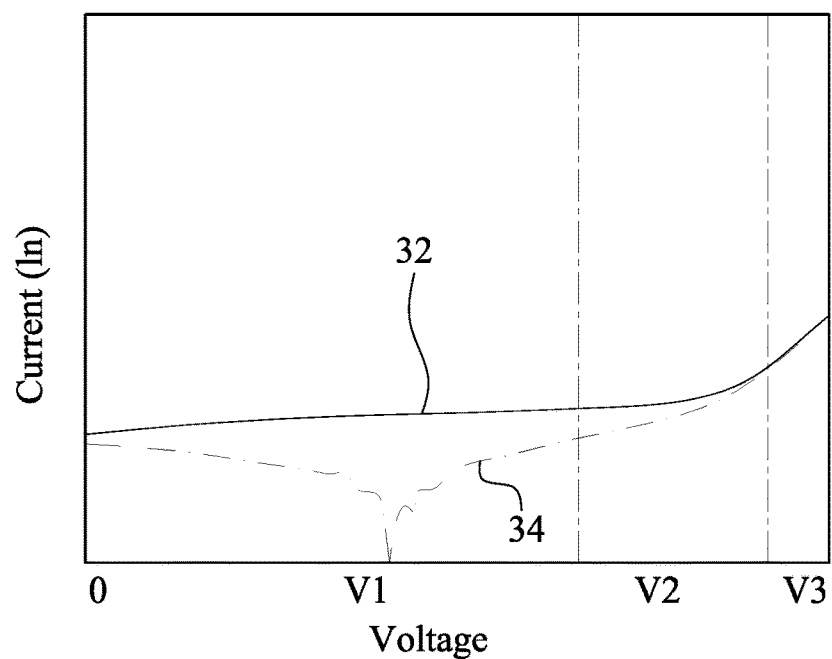
FIG. 3A is a simulated I-V curve of the memory cell C according to some embodiments.
Figure 3B:
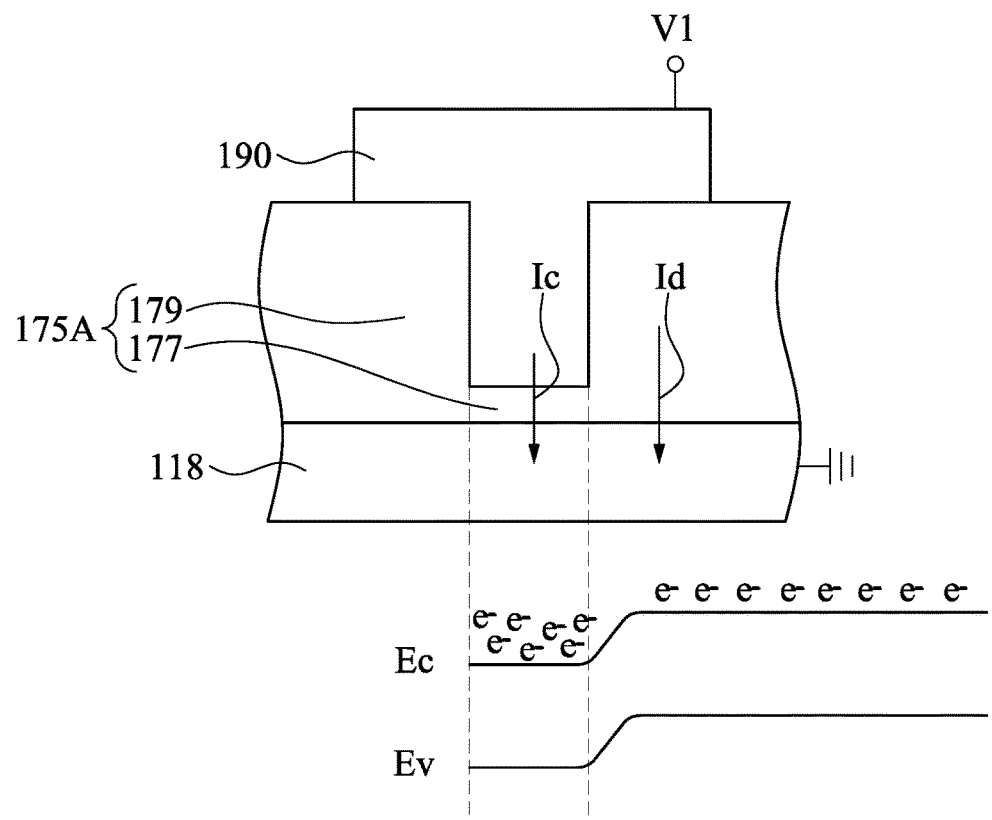
FIGS. 3B to 3D are illustrative band diagrams of the memory cell C with different applied voltages.
Figure 3C:
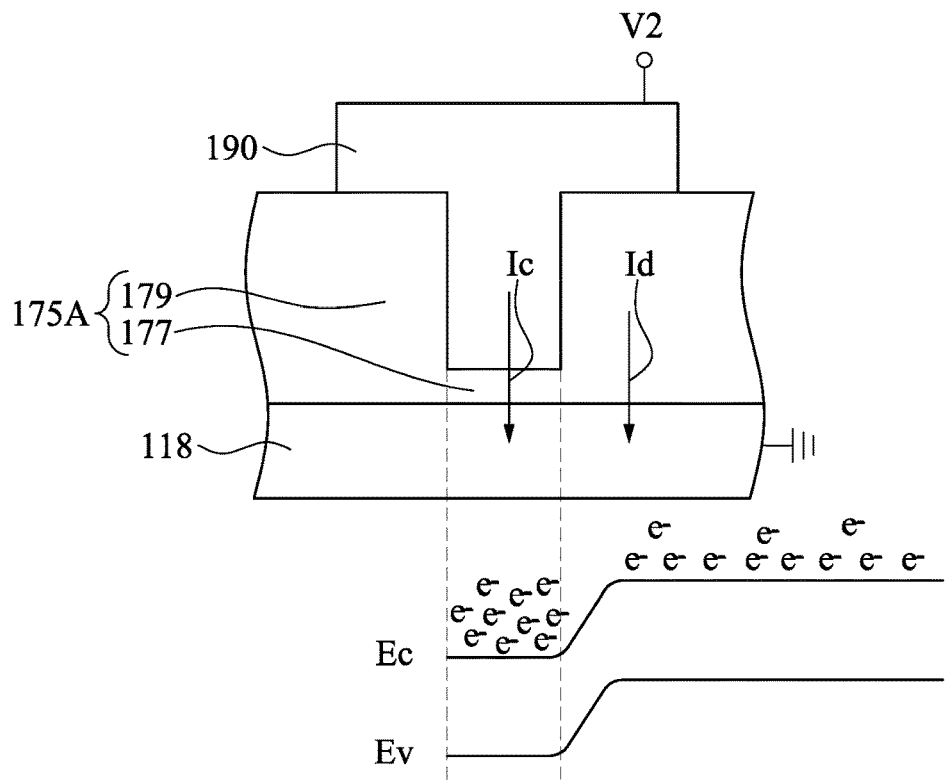
Figure 3D:
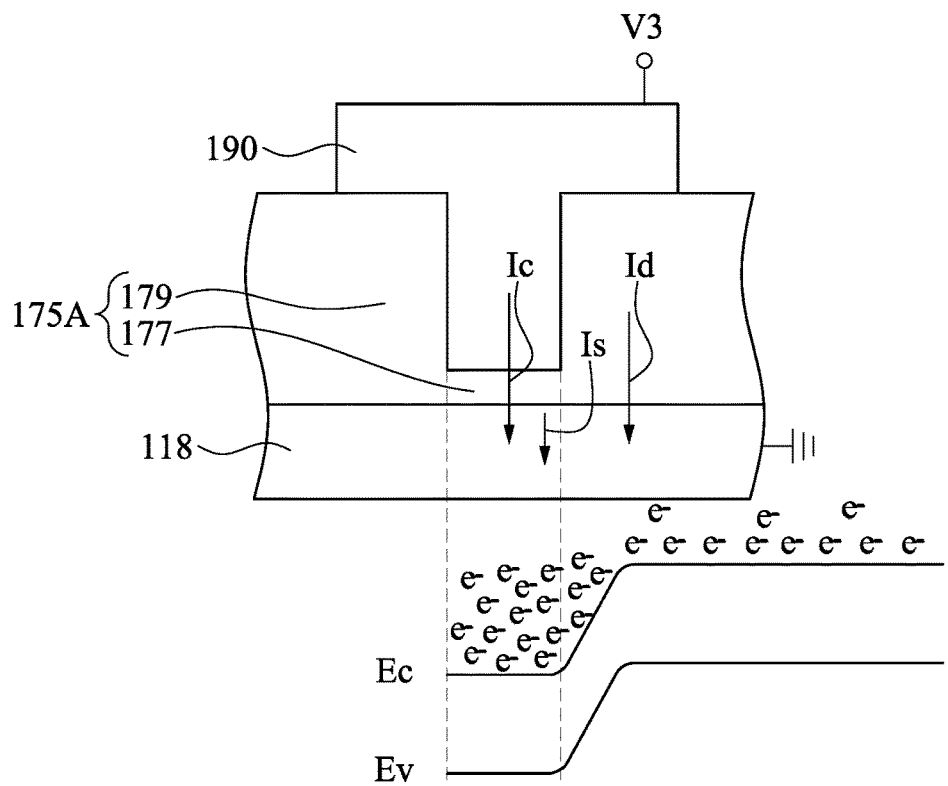

FIG. 3A is a simulated I-V curve of the memory cell C according to some embodiments, and FIGS. 3B to 3D are illustrative band diagrams of the memory cell C with different applied voltages. The solid line 32 in FIG. 3A represents the total transient current when the voltage is applied from low voltage to high voltage, and the dashed line 34 of FIG. 3A represents the total transient current when the voltage is applied from high voltage to low voltage. In the simulation of FIG. 3A, the efficient oxide thickness (EOT) of the thick portion was 35.2 nm, the EOT of the thin portion was 6.6 nm. When a voltage is applied to the top electrode 190 of the memory cell C, a conduction current Ic and a displacement current Id are both flow in the memory cell C. The conduction current Ic is the tunneling current between the top electrode 190 and the bottom electrode 118, and the tunneling current passes through the thin portion 177 of the dielectric structure 175A. The intensity of the tunneling current depends on the energy band difference between the thin portion 177 and the thick portion 179 of the dielectric structure 175A. On the other hand, when the voltage is applied between the top electrode 190 and the bottom electrode 118, the thin portion 177 of the dielectric structure 175A form a capacitor. For the displacement current Id, no actual charge is transported through the thin portion 177 between the top and bottom surfaces of the thin portion 177. Nonetheless, a magnetic field exists between the top and bottom surfaces as though a current (i.e., the displacement current Id) were present there as well. Moreover, voltage across the thin portion 177 is greater than the voltage across the thick portion 179. As such, the carrier (electron) density near the thin portion 177 is greater than that near the thick portion 179.

Reference is made to FIGS. 3A and 3B. When a low voltage V1 is applied to the top electrode 190 of the memory cell C, the conduction current Ic is much smaller than the displacement current Id, and the voltage difference between the thin portion 177 and the thick portion 179 is not so obvious. Thus, the displacement current Id dominates the total current.

Reference is made to FIGS. 3A and 3C. When the voltage is increased to a higher voltage V2, the conduction current Ic is increased. Also, the voltage difference between the thin portion 177 and the thick portion 179 is increased, such that the carrier density near the thin portion 177 is much greater than that near the thick portion 179. This carrier density difference forms a carrier diffusion phenomenon in the memory cell C. Moreover, the energy band difference between the thin portion 177 and the thick portion 179 becomes obvious, but this difference cancels out the carrier diffusion phenomenon. Thus, with the higher voltage applied, the conduction current Ic dominates the total current.

Reference is made to FIGS. 3A and 3D. When the voltage is increased to a much higher voltage V3, the conduction current Ic is further increased. Also, the voltage difference between the thin portion 177 and the thick portion 179 is further increased to form a deep depletion region in the portion of the bottom electrode 118 under the thin portion 177. This deep depletion region is due to the insufficient inversion carriers generated by thermal energy, and the deep depletion region suppresses the intensity of carrier diffusion. However, the energy band difference between the thin portion 177 and the thick portion 179 continues increases, and this energy band difference is stronger than the carrier diffusion and form a lateral extra carrier supply (LECS) phenomenon in the memory cell C, which form a LECS current Is. More specifically, the LECS phenomenon is associated with a reverse saturation current due to insufficient inversion carriers won't occur with extra supply from the lateral neighboring semiconductor region under the thick portion 179. Thus, with the much higher voltage V3 applied, the conduction current Ic and the LECS current Is dominate the total current.

Figure 4:
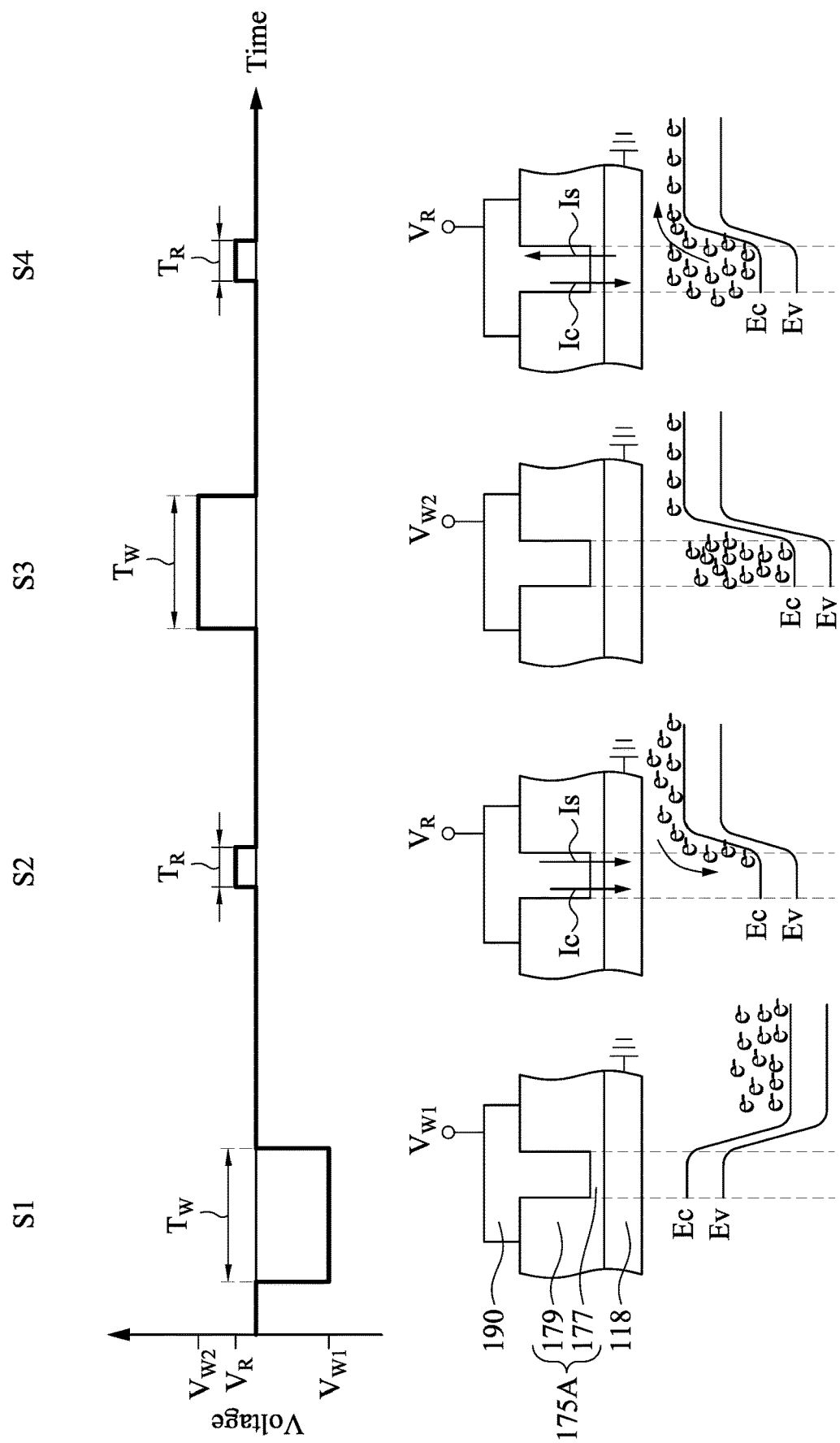
FIG. 4 is a signal timing diagram of write and read operations in a memory cell according to FIG. 2M, showing data and band diagrams at different operations according to some embodiments.

FIG. 4 is a signal timing diagram of write and read operations in a memory cell C according to FIG. 2M, showing data and band diagrams at different operations according to some embodiments. In operation S1, a writing voltage $V_{W1}$ is applied between the top electrode 190 and the bottom electrode 118. The writing voltage $V_{W1}$ causes a huge energy band difference between the thin portion 177 and the thick portion 179, in which the energy band of the thin portion 177 is much higher than that of the thick portion 179. With this energy state, the carrier density near the thick portion 179 is much higher than that near the thin portion 177.

In operation S2, a reading voltage $V_R$ is applied between the top electrode 190 and the bottom electrode 118. This voltage $V_R$ generates the conductive current Ic. Furthermore, an LECS current Is flows through the thin portion 177 due to the carrier density difference formed in operation S1. In this case, the conductive current Ic and the LECS current Is flow in the same direction, thus the total current equals to Ic+Is, which is referred to as a state "1".

In operation S3, another writing voltage $V_{W2}$ is applied between the top electrode 190 and the bottom electrode 118. The writing voltage $V_{W2}$ causes a huge energy band difference between the thin portion 177 and the thick portion 179, in which the energy band of the thin portion 177 is much lower than that of the thick portion 179. With this energy state, the carrier density near the thin portion 177 is much higher than that near the thick portion 179.

In operation S4, the reading voltage $V_R$ is applied between the top electrode 190 and the bottom electrode 118. This voltage $V_R$ generates the conductive current Ic. Furthermore, another LECS current Is flows through the thin portion 177 due to the carrier density difference formed in operation S3. In this case, the conductive current Ic and the LECS current Is flow in opposite directions, thus the total current equals to Ic−Is, which is referred to as a state "0".

In some embodiments, the writing voltage $V_{W1}$ is negative, and may be have a value less than about −10V, e.g., about −15V. In some embodiments, the writing voltage $V_{W2}$ is positive, and may be have a value greater than about 10V, e.g., about 12V. In some embodiments, the reading voltage $V_R$ is positive, and may be have a value in a range between 0V to about 10V, e.g., about 5.4V. In some embodiments, the writing period $T_W$ may be in a range of about 20 ns to about 1 ms, e.g., about 1 us. In some embodiments, the reading period $T_R$ may be in a range of about 20 ns to about 200 ms, e.g., about 200 ms.

In some embodiments, the memory window (i.e., the reading current difference between the two states (state "1" and state "0" as mentioned above) of the memory cell C is stable and greater than about 20 pA, which is distinguishable enough for the two states. Moreover, the retention time of the memory cell c is greater than about 100 ms, e.g., about 200 ms, which is qualified for embedded DRAM applications. Furthermore, the area ratio of top electrode as mentioned above controls the LECS effect of the memory cell. More specifically, as the area ratio increases, the LECS effect increases, and thus the memory window increases as well.

Figure 5A:
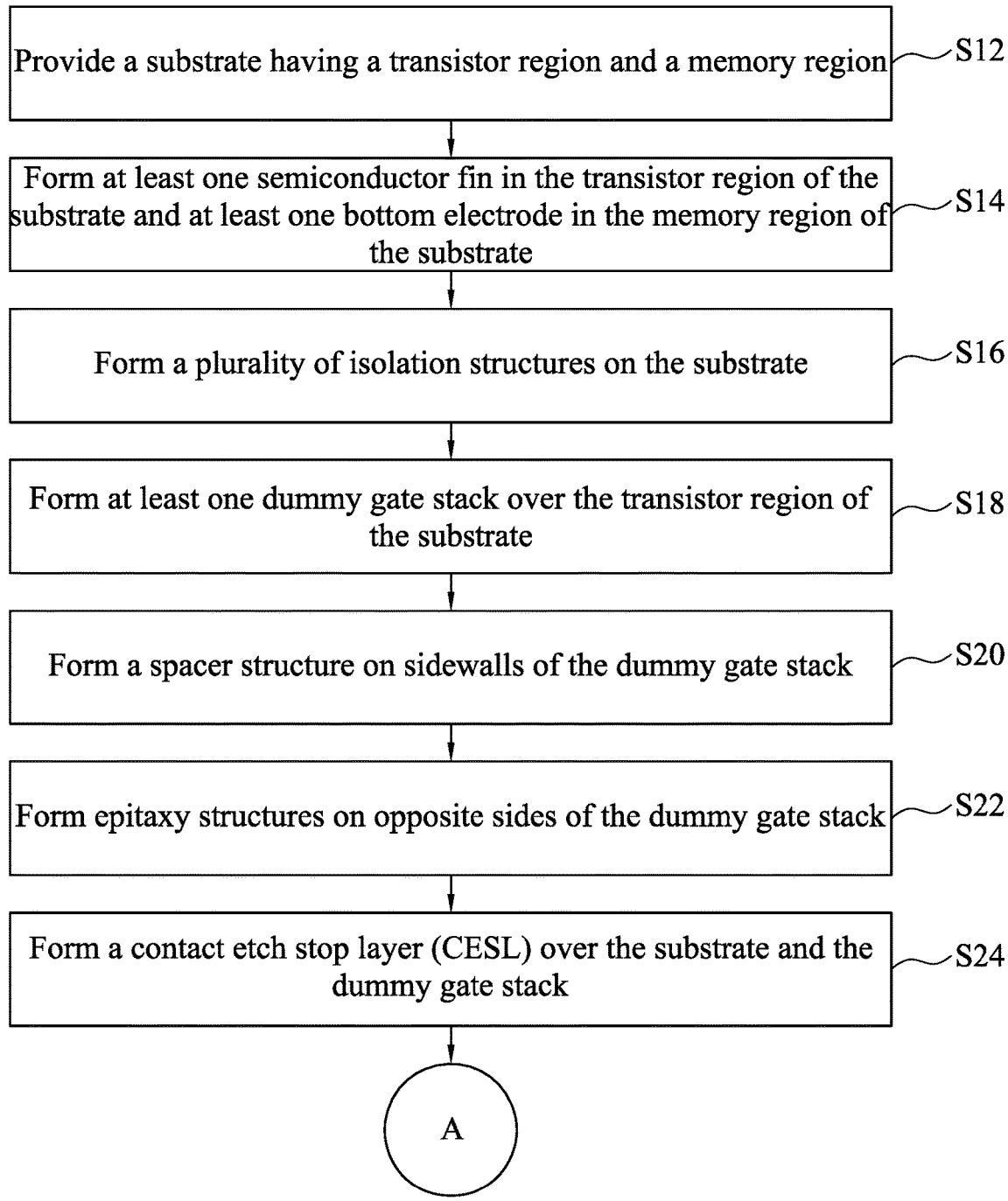
FIGS. 5A and 5B are a flowchart of a method for making a memory device according to aspects of the present disclosure in various embodiments.
Figure 5B:
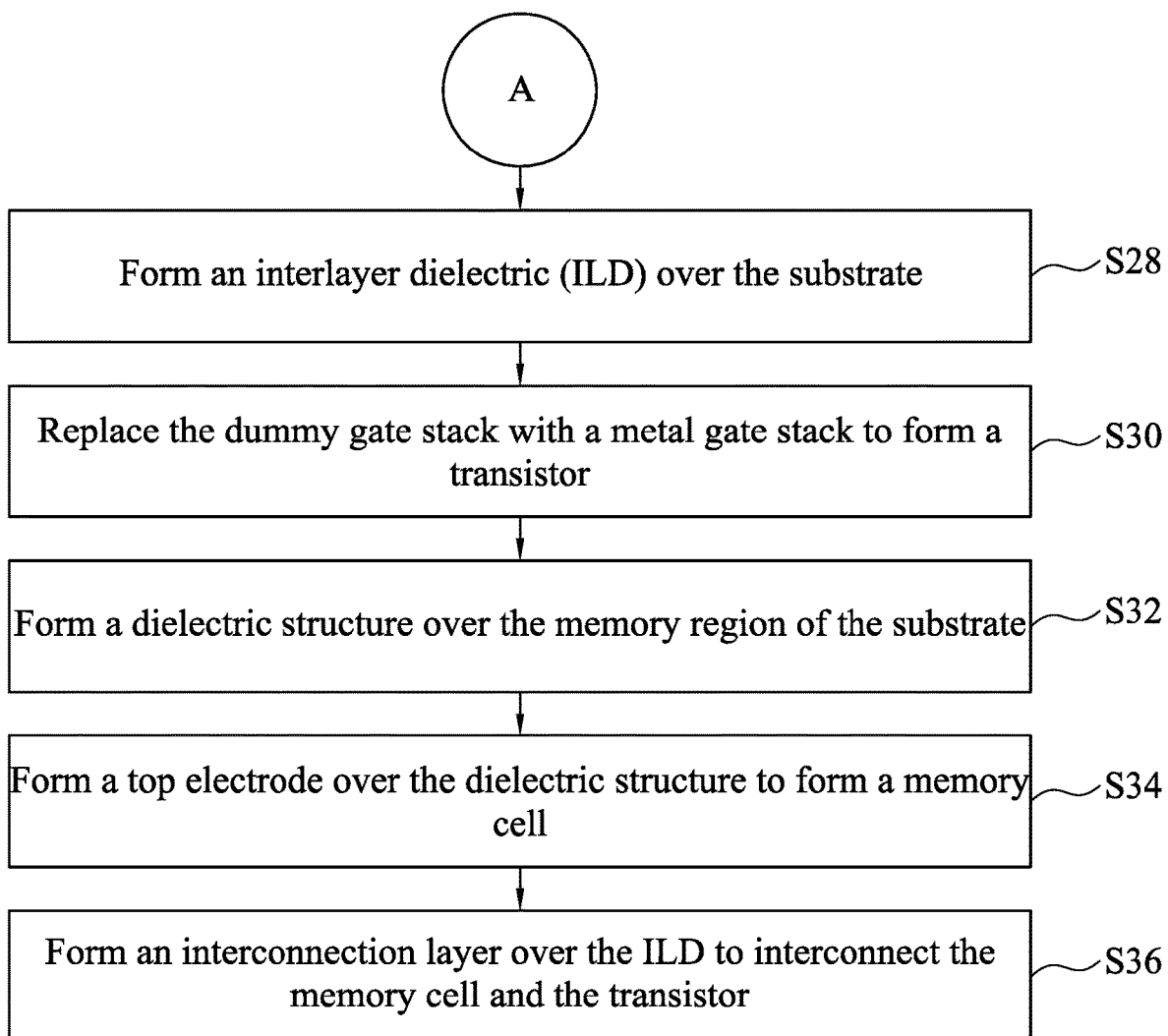
Figure 6A:
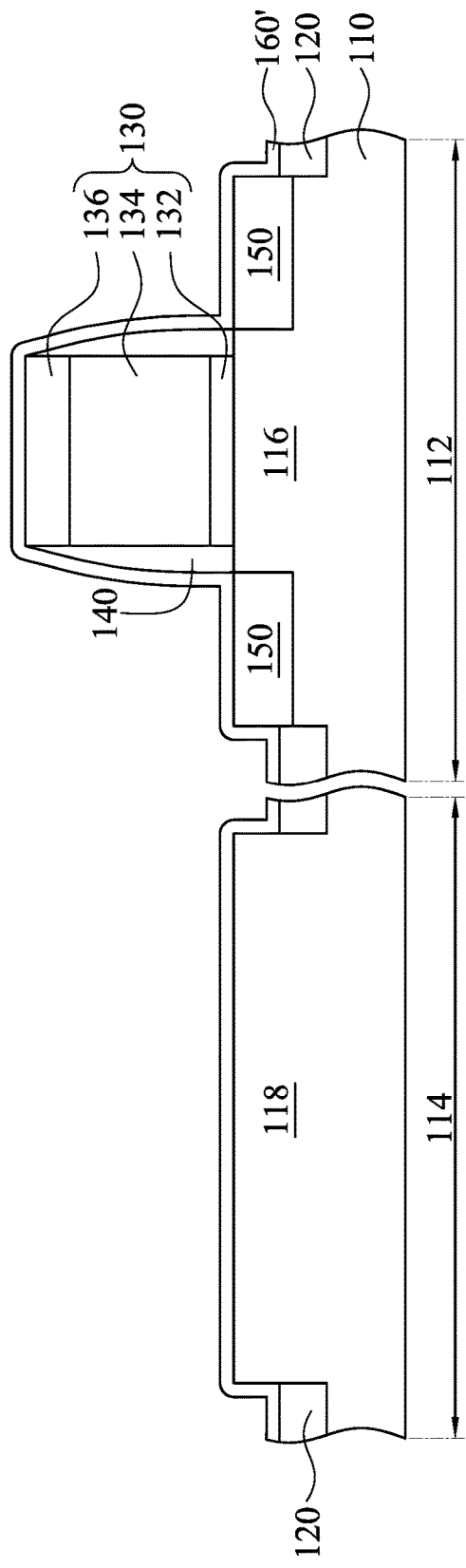
FIGS. 6A to 6D respectively illustrate cross-sectional views of the memory device at various stages in accordance with some embodiments of the present disclosure.

FIGS. 5A and 5B are a flowchart of a method M10B for making a memory device according to aspects of the present disclosure in various embodiments. Various operations of the method M10B are discussed in association with perspective diagrams FIGS. 6A-6D. Throughout the various views and illustrative embodiments, like reference numbers are used to designate like elements. The present embodiment may repeat reference numerals and/or letters used in FIGS. 2A-2M. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 6A-6D. In operation S12 of method M10B, a substrate 110 is provided. In operation S14 of method M10B, at least one semiconductor fin 116 is formed in the transistor region 112 of the substrate 110 and at least one bottom electrode 118 is formed in the memory region of the substrate 110. In operation S16 of method M10B, a plurality of isolation structures 120 are formed on the substrate 110. In operation S18 of method M10B, at least one dummy gate stack 130 is formed over the transistor region 112 of the substrate 110. In operation S20 of method M10B, a spacer structure 140 is formed on sidewalls of the dummy gate stack 130. In operation S22 of method M10B, epitaxy structures 150 are formed on opposite sides of the dummy gate stack 130. In operation S24 of method M10B, a contact etch stop layer (CESL) 160' is conformally formed over the substrate 110 and the dummy gate stack 130, as shown in FIG. 6A.

Figure 6B:
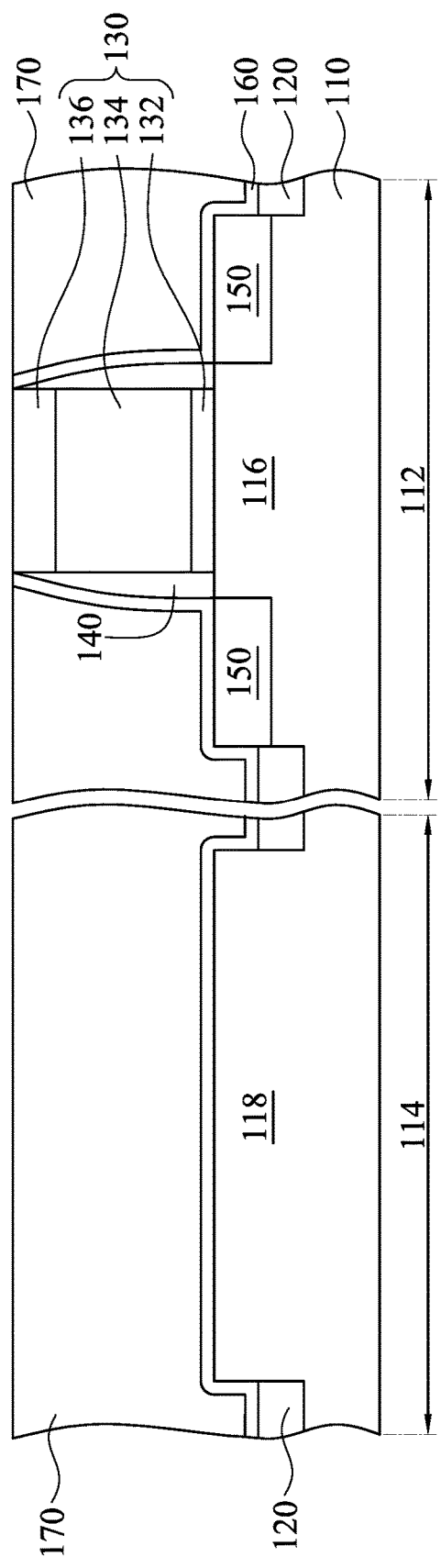

In operation S28 of method M10B, an interlayer dielectric (ILD) 170 is formed over the substrate 110, as shown in FIG. 6B. The ILD 170 covers the CESL 160'. In some embodiments, the ILD 170 may be formed by depositing a dielectric material over the CESL 160' and then a planarization process is performed to the dielectric material and the CESL 160' to expose the dummy gate stack 130. In some embodiments, the deposition process may be chemical vapor deposition (CVD), high-density plasma CVD, spin-on, sputtering, or other suitable methods. In some embodiments, the ILD 170 includes silicon oxide. In some other embodiments, the ILD 170 may include silicon oxy-nitride, silicon nitride, or a low-k material.

Figure 6C:
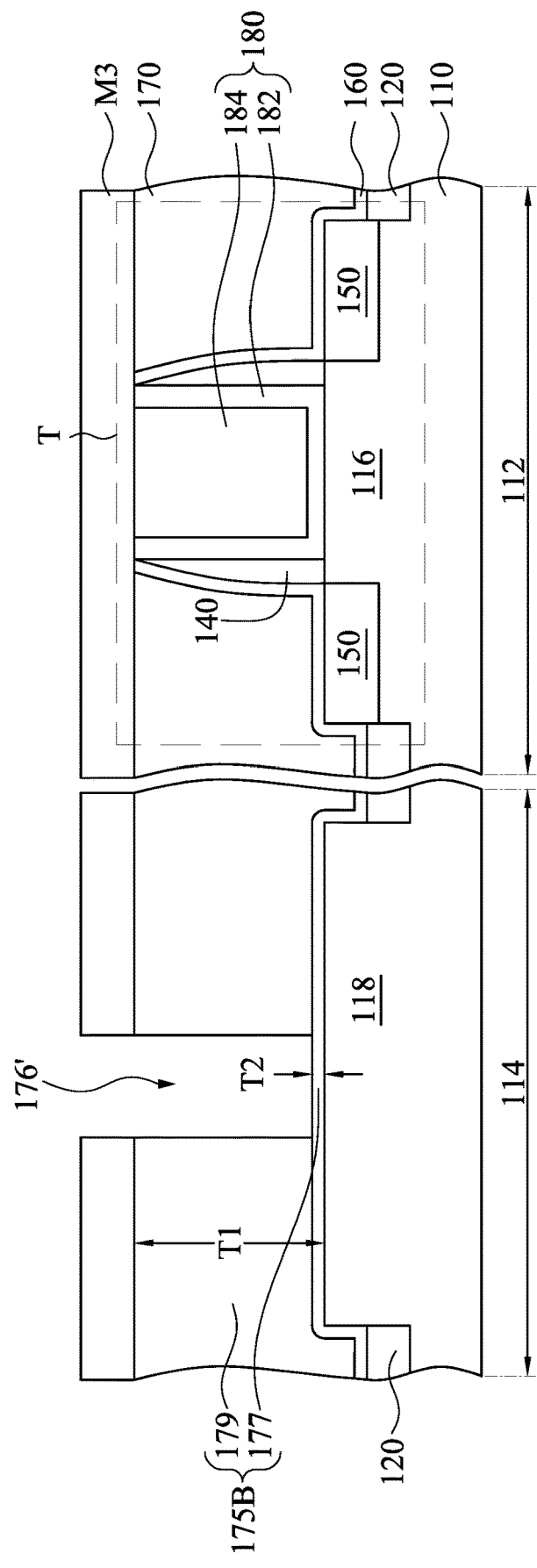

Reference is made to FIG. 6C. In operation S30 of method M10B, the dummy gate stack 130 (see FIG. 6B) is replaced with a metal gate stack 180. The metal gate stack 180 includes the gate dielectric layer 182 and a metal gate electrode 184 over the gate dielectric layer 182. In operation S32 of method M10B, a dielectric structure 175B is formed over the memory region 114 of the substrate 110. In some embodiments, another mask M3 is formed over the ILD 170, and a portion of the ILD 170 over the memory region 114 of the substrate 110 is exposed by the mask M3. Then, the ILD 170 is patterned, and an opening 176' is formed in the portion of the ILD 170 over the memory region 114 of the substrate 110. The opening 176' exposes the CESL 160'.

In FIG. 6C, the dielectric structure 175B includes a thin portion 177 and a thick portion 179. The thin portion 177 includes a portion of the CESL 160' exposed by the opening 176', and the thick portion 179 includes a portion of the ILD 170 and another portion of the CESL 160' covered by the ILD 170. The thin portion 177 has a thickness T2 less than the thickness T1 of the thick portion 179.

Figure 6D:
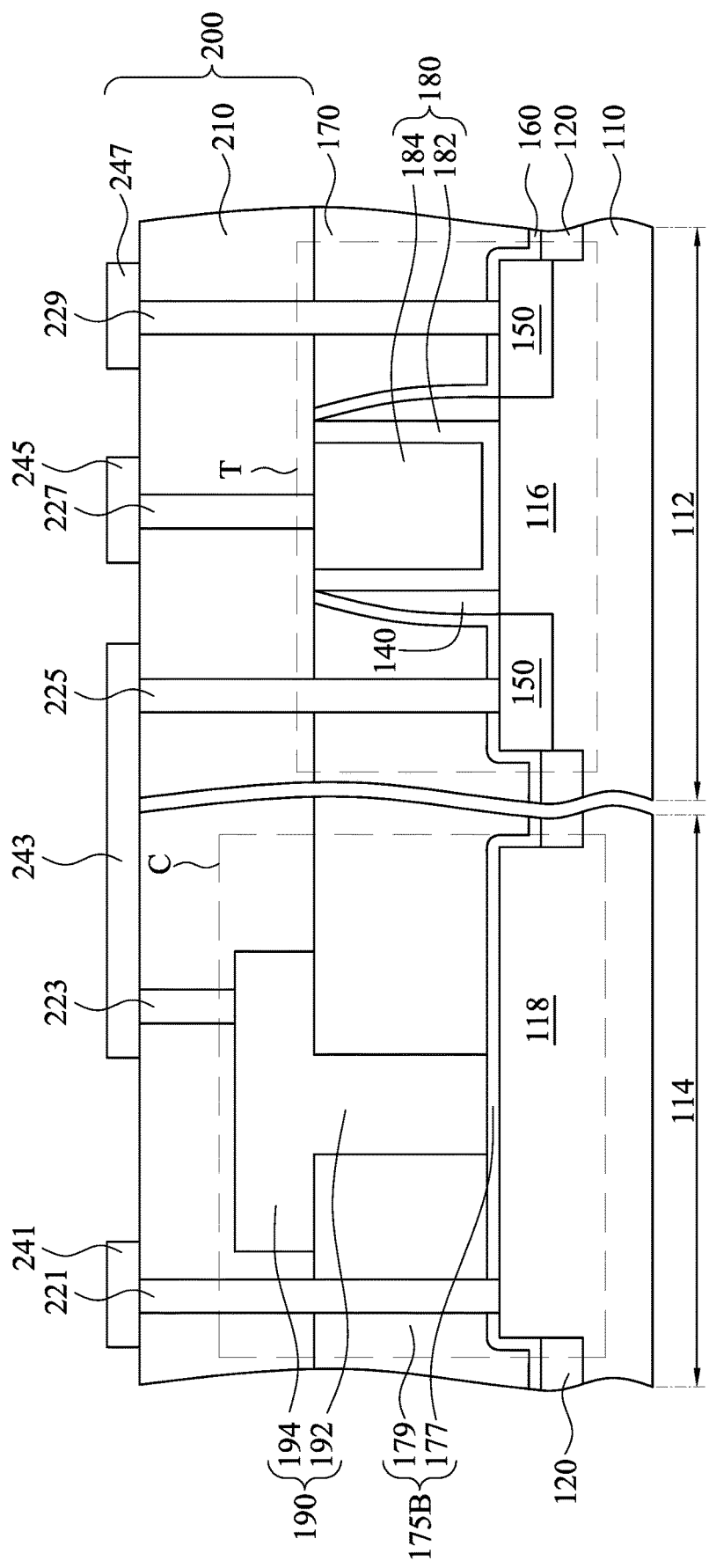

Reference is made to FIG. 6D. In operation S34 of method M10B, a top electrode 190 is formed over the dielectric structure 175B. The bottom electrode 118, the dielectric structure 175B, and the top electrode 190 are referred to as a memory cell C. In operation S36 of method M10B, an interconnect layer 200 is formed over the ILD 170 to interconnect the memory cell C and the transistor T. In some other embodiments, the memory cell C may be formed before the metal gate stack 180. That is, the operations S32 and S34 may be performed before the operation S30 in FIGS. 5A and 5B.

Figure 7A:
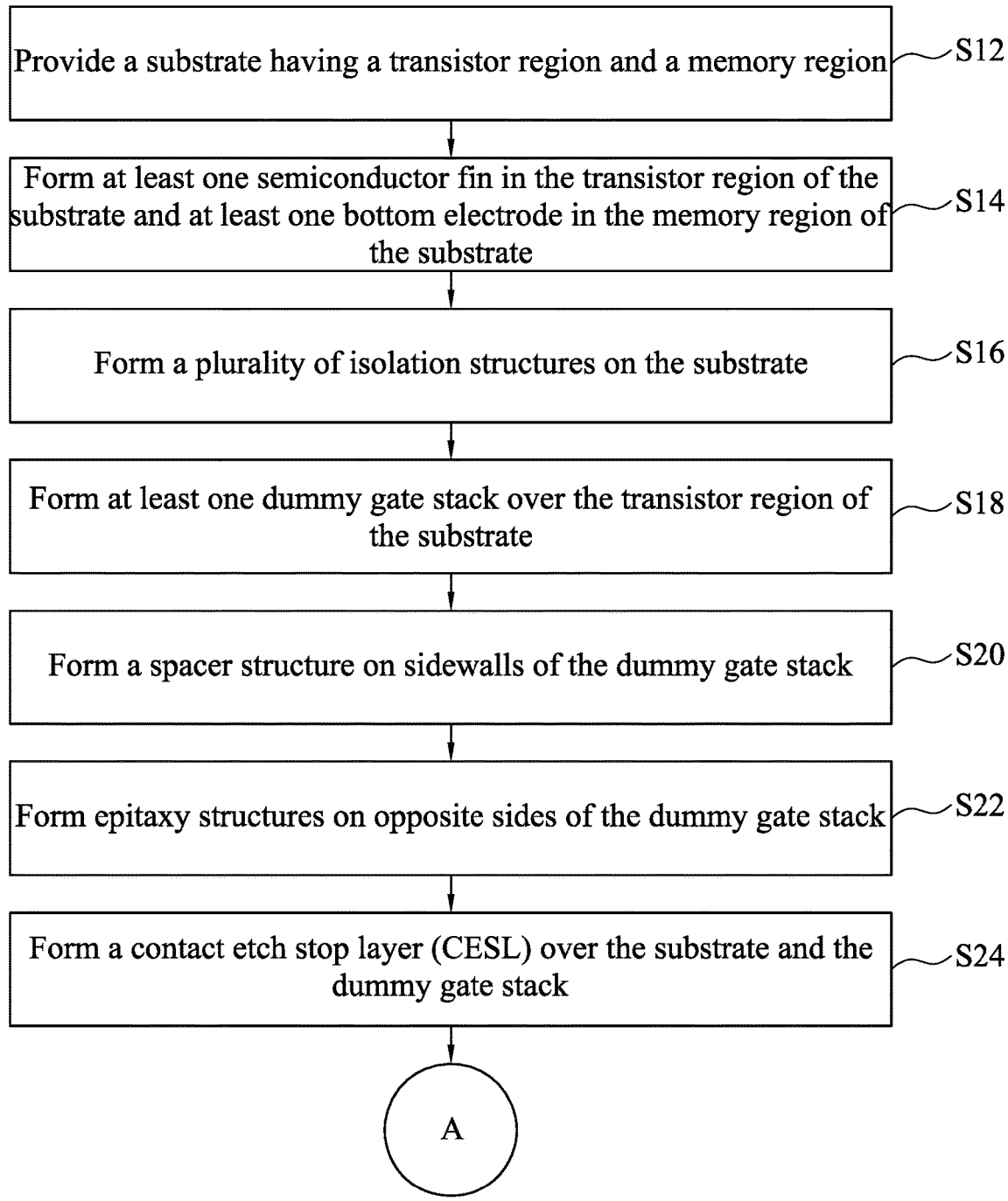
FIGS. 7A and 7B are a flowchart of a method for making a memory device according to aspects of the present disclosure in various embodiments.
Figure 7B:
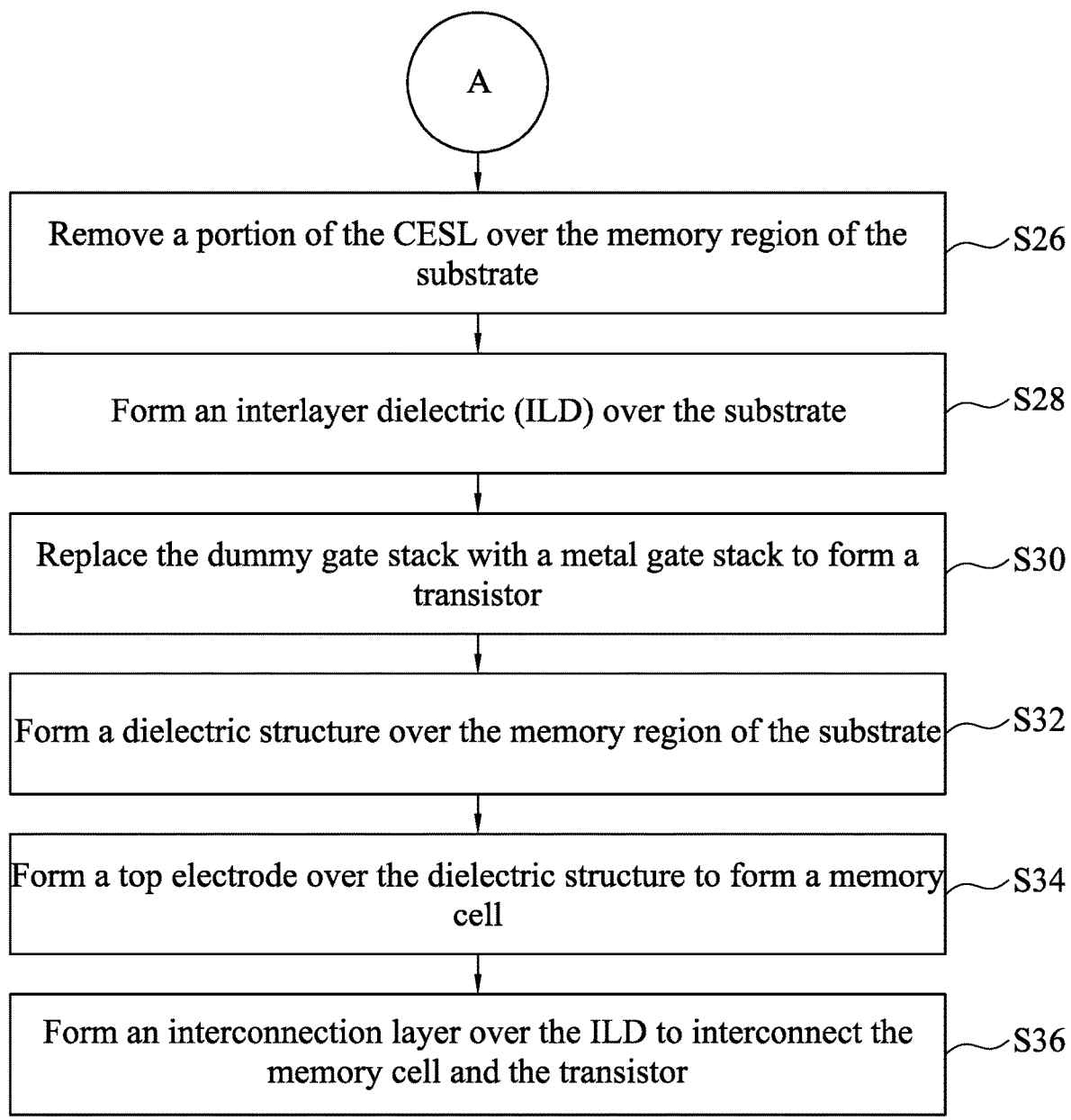
Figure 8A:
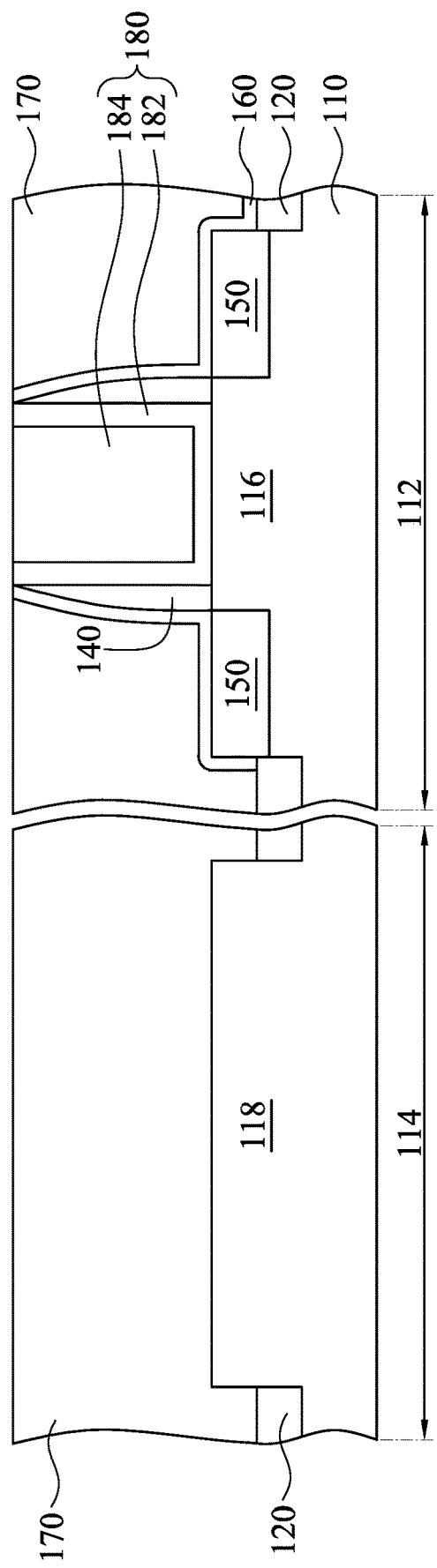
FIGS. 8A to 8D respectively illustrate cross-sectional views of the memory device at various stages in accordance with some embodiments of the present disclosure.

FIGS. 7A and 7B are a flowchart of a method M10C for making a memory device according to aspects of the present disclosure in various embodiments. Various operations of the method M10C are discussed in association with perspective diagrams FIGS. 8A-8D. Throughout the various views and illustrative embodiments, like reference numbers are used to designate like elements. The present embodiment may repeat reference numerals and/or letters used in FIGS. 2A-2M. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 8A-8D. Reference is made to FIG. 8A. In operation S12 of method M10C, a substrate 110 is provided. In operation S14 of method M10C, at least one semiconductor fin 116 is formed in the transistor region of the substrate 110 and at least one bottom electrode 118 is formed in the memory region of the substrate 110. In operation S16 of method M10C, a plurality of isolation structures 120 are formed on the substrate 110. In operation S18 of method M10C, at least one dummy gate stack 130 is formed over the transistor region 112 of the substrate 110. In operation S20 of method M10C, a spacer structure 140 is formed on sidewalls of the dummy gate stack 130. In operation S22 of method M10C, epitaxy structures 150 are formed on opposite sides of the dummy gate stack 130. In operation S24 of method M10C, a contact etch stop layer (CESL) 160' is conformally formed over the substrate 110 and the dummy gate stack 130, as shown in FIG. 6A. In operation S26 of method M10C, a portion of the CESL 160' over the memory region 114 of the substrate 110 is removed. In operation S28 of method M10C, an interlayer dielectric (ILD) 170 is formed over the substrate 110. In operation S30 of method M10C, the dummy gate stack 130 is replaced with a metal gate stack 180.

Figure 8B:
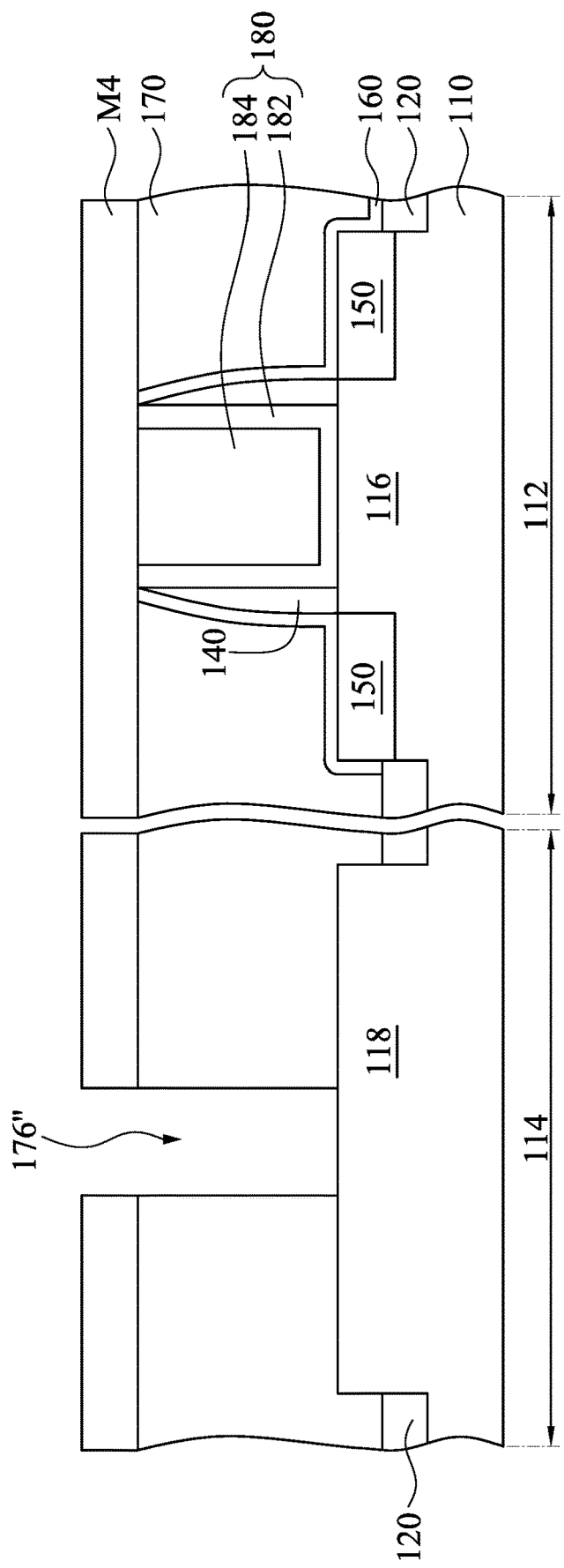
Figure 8C:
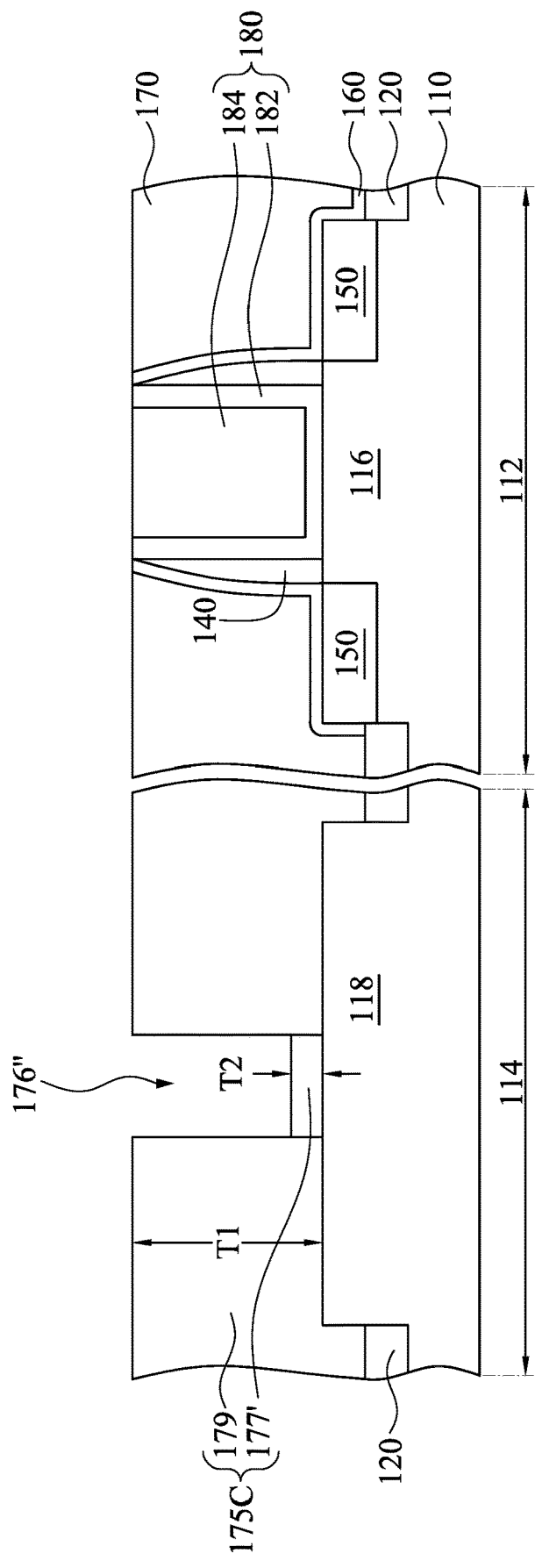

In operation S32 of method M10C, a dielectric structure 175C is formed over the memory region 114 of the substrate 110, as shown in FIGS. 8B and 8C. Referring to FIG. 8B, in some embodiments, another mask M4 is formed over the ILD 170, and a portion of the ILD 170 over the memory region 114 of the substrate 110 is exposed by the mask M4. Then, the ILD 170 is patterned, and an opening 176" is formed in the portion of the ILD 170 over the memory region 114 of the substrate 110. The opening 176" exposes the bottom electrode 118.

Referring to FIG. 8C. A dielectric layer 177' is formed in the opening 176" and over the bottom electrode 118. In some embodiments, a dielectric layer is deposited over the structure of FIG. 8B, such that the dielectric layer is formed in the opening 176" and over the mask M4 (see FIG. 8B). Then, the mask M4 is removed, and the remaining dielectric layer (the portion of the dielectric layer in the opening 176") is referred to as the dielectric layer 177'. The dielectric structure 175C includes the dielectric layer 177' (referred to as a thin portion) and the portion of the ILD 170 over the memory region 114 (referred to as a thick portion). The dielectric layer 177' may be made of silicon oxide, silicon dioxide, silicon nitride, or high-k dielectrics (e.g., $HfO_2$, $ZrO_2$, $Al_2O_3$, or other suitable materials.

Figure 8D:
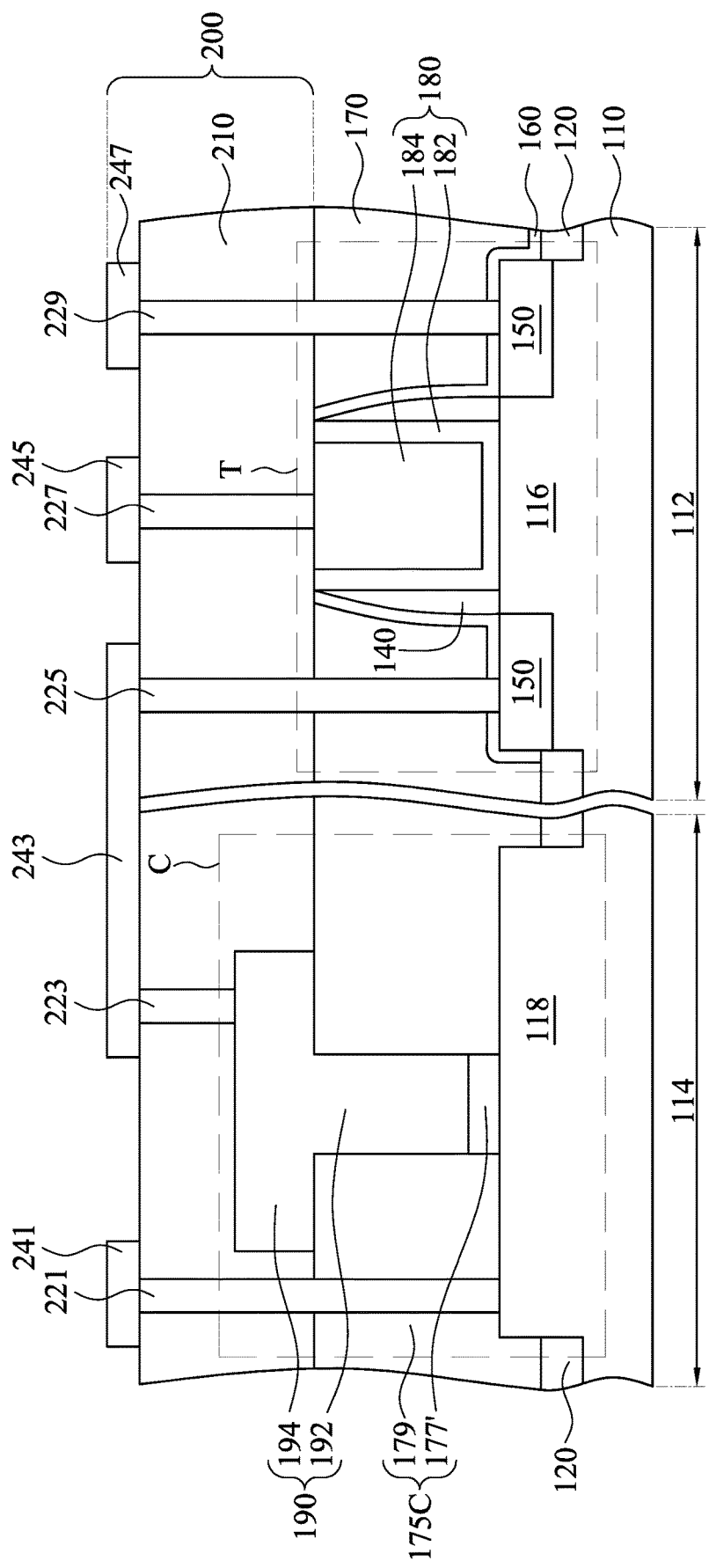

Reference is made to FIG. 8D. In operation S34 of method M10C, a top electrode 190 is formed over the dielectric structure 175C. As such, the bottom electrode 118, the dielectric structure 175C, and the top electrode 190 are referred to as a memory cell C. In operation S36 of method M10C, an interconnect layer 200 is formed over the ILD 170 to interconnect the memory cell C and the transistor T. In some other embodiments, the memory cell C may be formed before the metal gate stack 180. That is, the operations S32 and S34 may be performed before the operation S30 in FIGS. 7A and 7B.

Figure 9A:
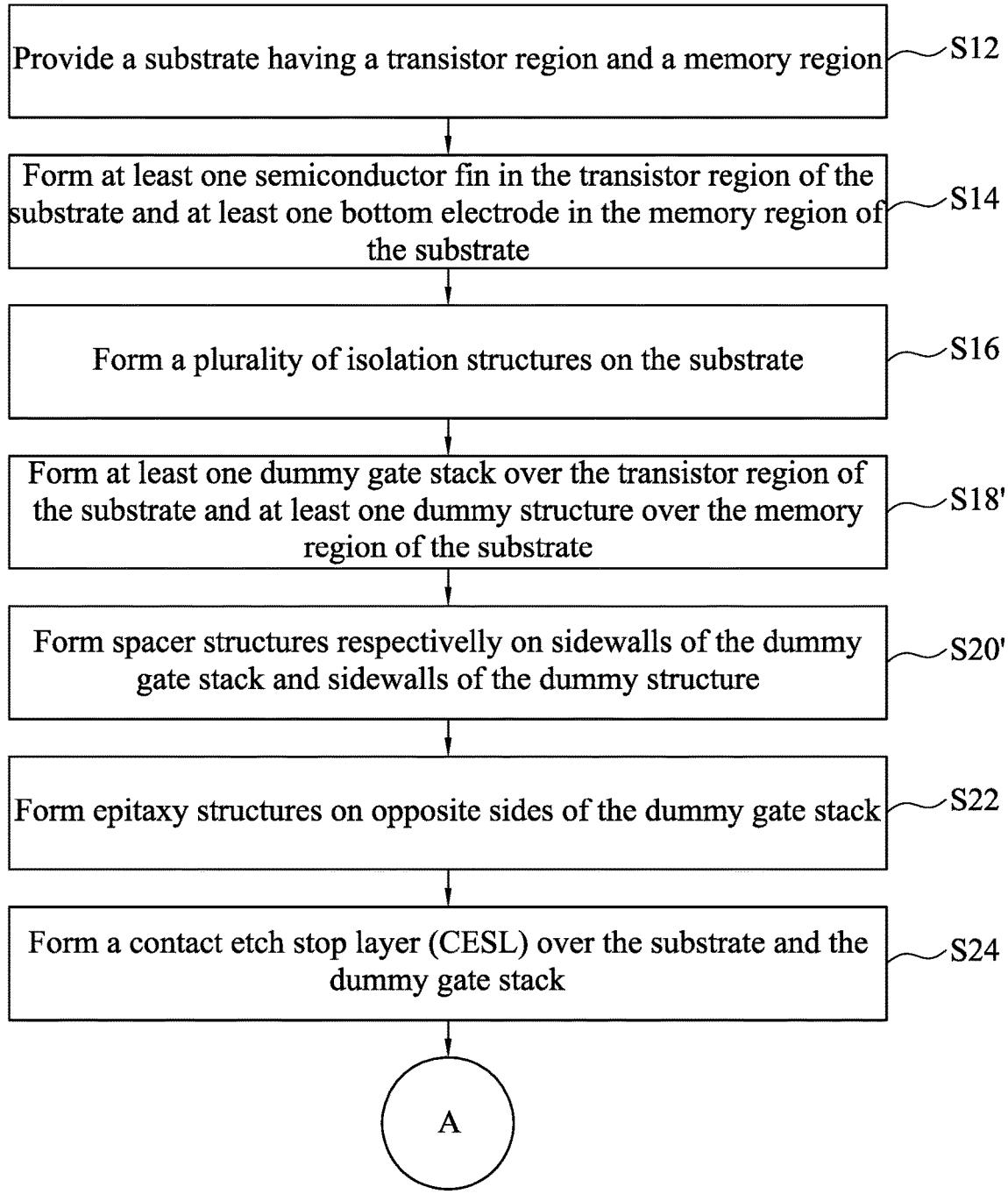
FIGS. 9A and 9B are a flowchart of a method for making a memory device according to aspects of the present disclosure in various embodiments.
Figure 9B:
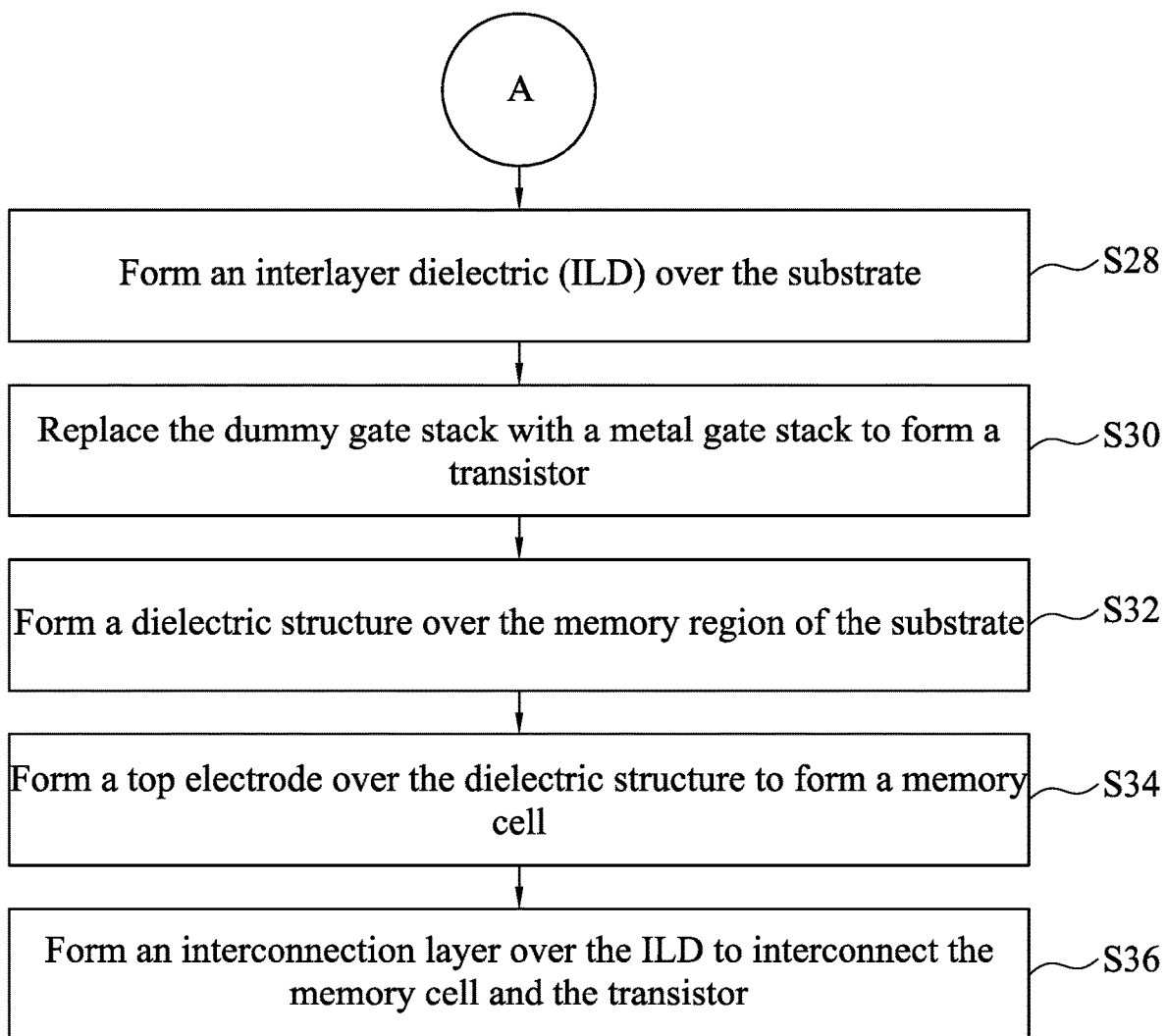
Figure 10A:
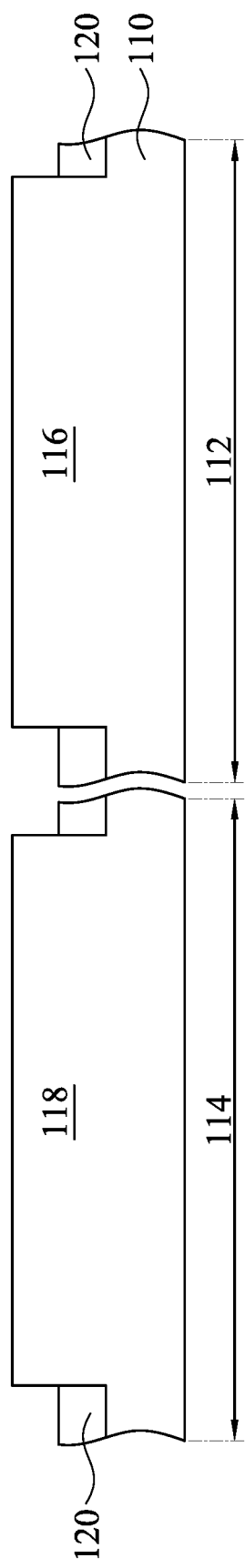
FIGS. 10A to 10F respectively illustrate cross-sectional views of the memory device at various stages in accordance with some embodiments of the present disclosure.

FIGS. 9A and 9B are a flowchart of a method M10D for making a memory device according to aspects of the present disclosure in various embodiments. Various operations of the method M10D are discussed in association with perspective diagrams FIGS. 10A-10F. Throughout the various views and illustrative embodiments, like reference numbers are used to designate like elements. The present embodiment may repeat reference numerals and/or letters used in FIGS. 2A-2M. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 10A-10F. Reference is made to FIG. 10A. In operation S12 of method M10D, a substrate 110 is provided. In operation S14 of method M10D, at least one semiconductor fin 116 is formed in the transistor region of the substrate 110 and at least one bottom electrode 118 is formed in the memory region of the substrate 110. In operation S16 of method M10D, a plurality of isolation structures 120 are formed on the substrate 110.

Figure 10B:
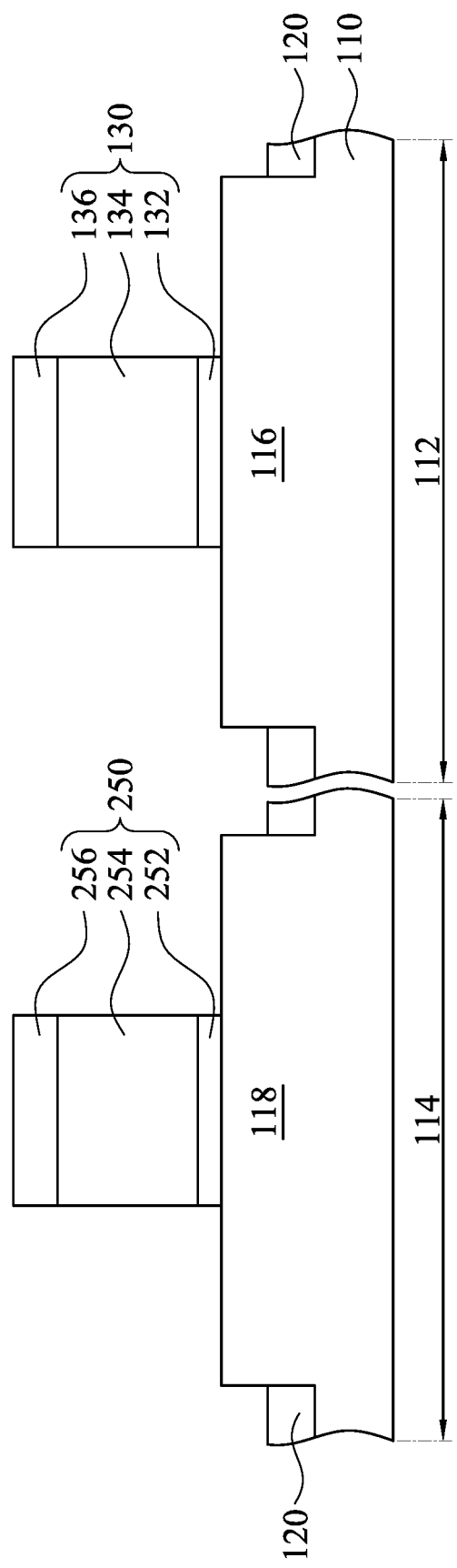

In operation S18' of method M10D, at least one dummy gate stack 130 is formed over the transistor region 112 of the substrate 110 and at least one dummy structure 250 is formed over the memory region 114 of the substrate 110, as shown in FIG. 10B. The dummy gate stack 130 includes a dummy dielectric layer 132, a dummy gate electrode 134 formed over the dummy dielectric layer 132, and a hard mask layer 136 formed over the dummy gate electrode 134. The dummy structure 250 includes a dielectric layer 252, a dummy layer 254 formed over the dielectric layer 252, and a hard mask layer 256 formed over the dummy layer 254. In some embodiments, a dummy dielectric film and a dummy gate layer (not shown) may be sequentially formed over the substrate 110, and the hard mask layers 136 and 256 are formed over the dummy gate layer. The dummy gate layer and the dummy dielectric film are then patterned using the hard mask layers 136 and 256 as masks to form the dummy gate electrode 134 (the dummy layer 254) and the dummy dielectric layer 132 (the dielectric layer 252). As such, the dummy dielectric layer 132, the dummy gate electrode 134 and the hard mask layer 136 are referred to as the dummy gate stack 130, and the dielectric layer 252, the dummy layer 254, and the hard mask layer 256 are referred to as the dummy structure 250. In some embodiments, the dummy dielectric layer 132 and the dielectric layer 252 may include silicon dioxide, silicon nitride, a high-κ dielectric material or other suitable material. In various examples, the dummy dielectric layer 132 may be deposited by a thermal process, an ALD process, a CVD process, a subatmospheric CVD (SACVD) process, a flowable CVD process, a PVD process, or other suitable process. In some embodiments, the dummy gate electrode 134 and the dummy layer 254 may be made of polycrystalline-silicon (poly-Si), poly-crystalline silicon-germanium (poly-SiGe), or other suitable materials. The hard mask layers 136 and 256 may be made of silicon nitride or other suitable materials.

Figure 10C:
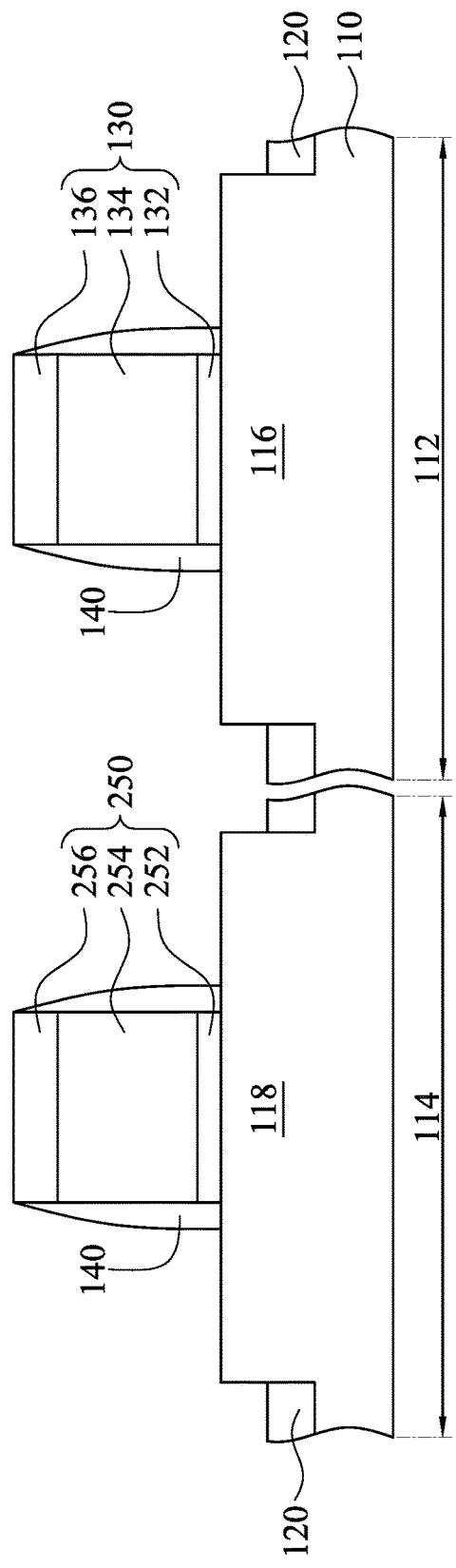

In operation S20' of method M10D, spacer structures 140 are respectively formed on sidewalls of the dummy gate stack 130 and sidewalls of the dummy structure 250, as shown in FIG. 10C. The spacer structure 140 may include a seal spacer and a main spacer (not shown). The spacer structure 140 includes one or more dielectric materials, such as silicon oxide, silicon nitride, silicon oxynitride, SiCN, $SiC_xO_yN_z$, or combinations thereof. The seal spacers are formed on sidewalls of the dummy gate stack 130 and the main spacers are formed on the seal spacers. The spacer structure 140 may be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structure 140 may include blanket forming spacer layers and then performing etching operations to remove the horizontal portions of the spacer layers. The remaining vertical portions of the spacer layers form the spacer structure 140.

Figure 10D:
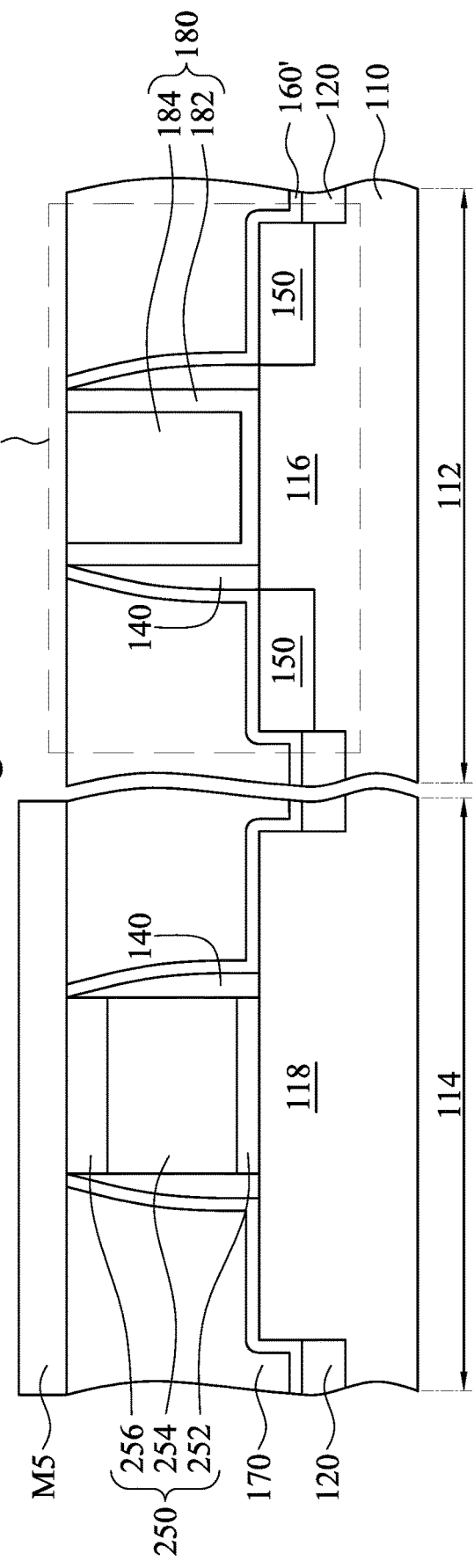

Reference is made to FIG. 10D. In operation S22 of method M10D, epitaxy structures 150 are formed on opposite sides of the dummy gate stack 130. In operation S24 of method M10D, a contact etch stop layer (CESL) 160' is conformally formed over the substrate 110, the dummy gate stack 130, and the dummy structure 250. In operation S28 of method M10D, an interlayer dielectric (ILD) 170 is formed over the substrate 110. In operation S30 of method M10D, the dummy gate stack 130 (see FIG. 10C) is replaced with a metal gate stack 180. For example, another mask M5 may be formed over the memory region 114 of the substrate 110, and the mask M5 exposes the dummy gate stack 130. Then, the dummy gate stack 130 is replaced with the metal gate stack 180 as mentioned above. The metal gate stack 180 includes the gate dielectric layer 182 and a metal gate electrode 184 over the gate dielectric layer 182.

Figure 10E:
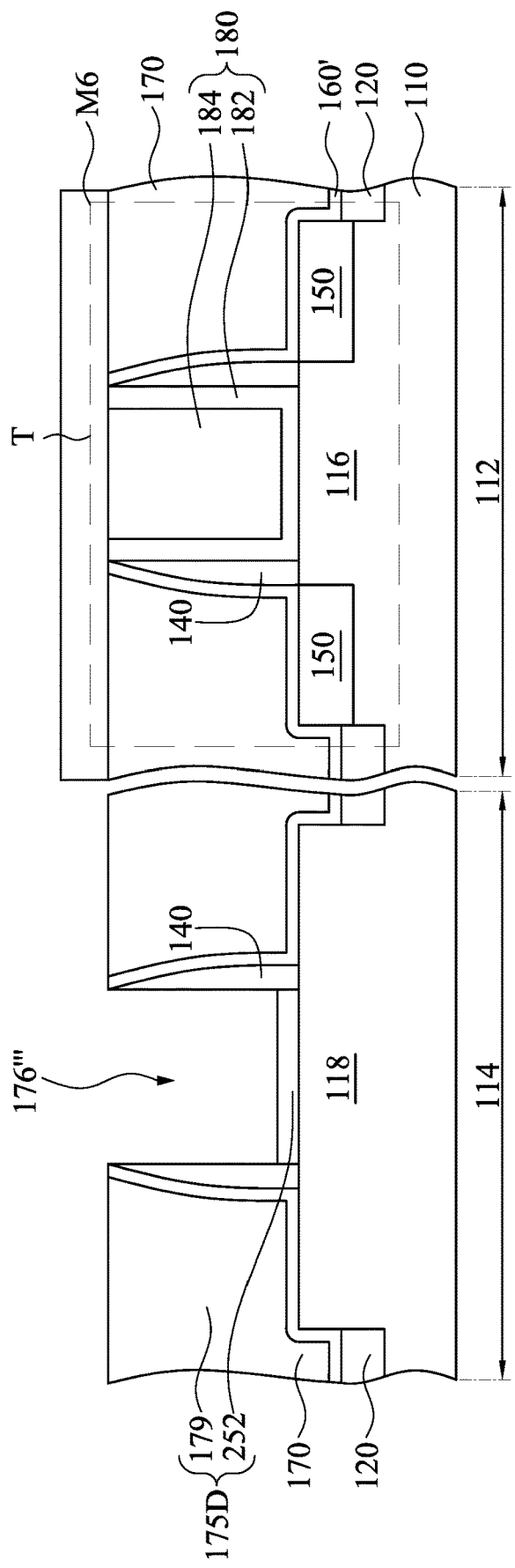

In operation S32 of method M10D, a dielectric structure 175D is formed over the memory region 114 of the substrate 110, as shown in FIG. 10E. For example, the mask M5 in FIG. 10D is removed, and another mask M6 is formed over the transistor region 112 of the substrate 110. The mask M6 at least exposes the dummy structure 250 (see FIG. 10D). Then, the hard mask layer 256 and the dummy layer 254 are both removed to form an opening 176''' over the memory region 114 of the substrate 110. The dielectric structure 175D includes a thin portion (i.e., the dielectric layer 252) and a thick portion 179 (i.e., the ILD 170, the spacer structure 140, and the CESL 160' over the memory region 114).

Figure 10F:
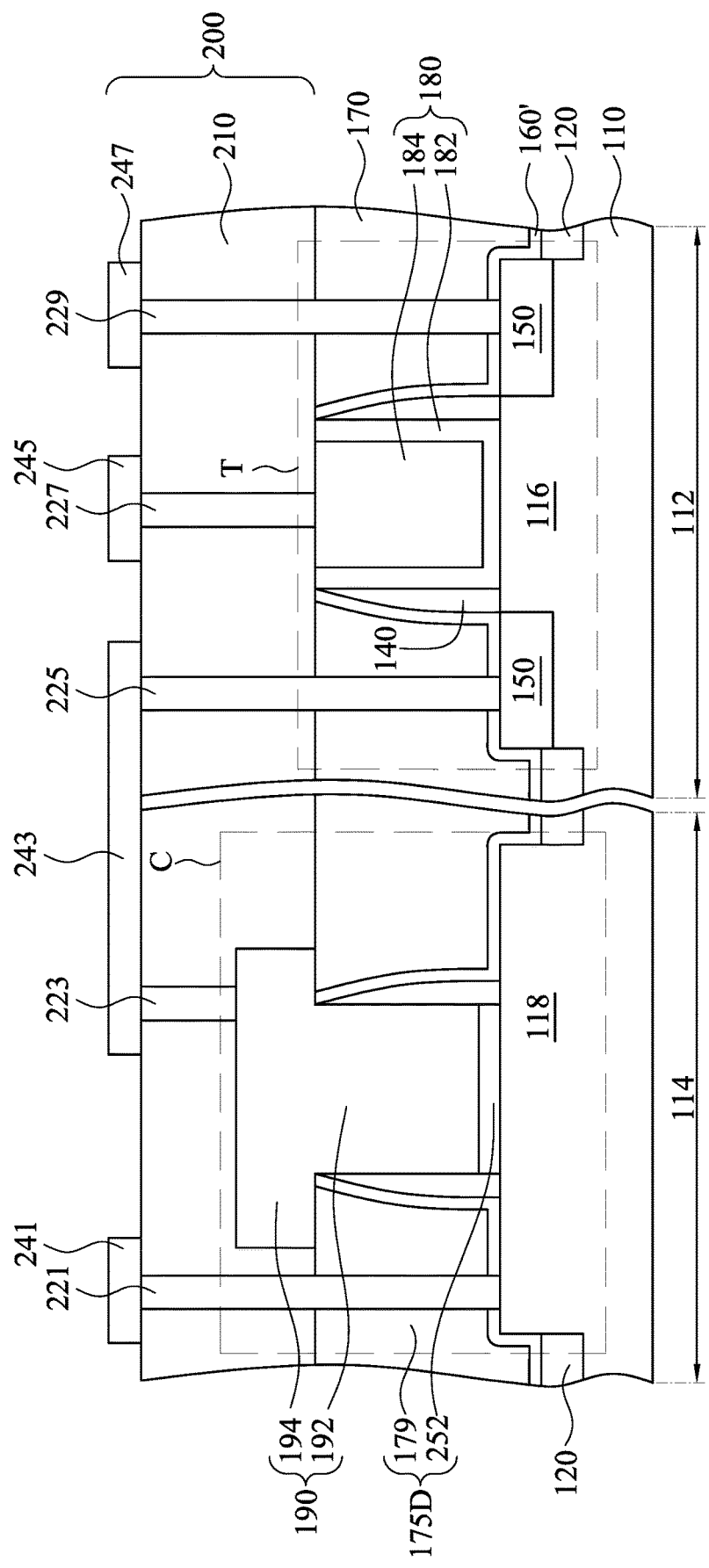

Reference is made to FIG. 10F. In operation S34 of method M10D, a top electrode 190 is formed over the dielectric structure 175D. Thus, the bottom electrode 118, the dielectric structure 175D, and the top electrode 190 are referred to as a memory cell C. In operation S36 of method M10D, an interconnect layer 200 is formed over the ILD 170 to interconnect the memory cell C and the transistor T. In some other embodiments, the memory cell C may be formed before the metal gate stack 180. That is, the operations S32 and S34 may be performed before the operation S30 in FIGS. 9A and 9B.

Figure 11A:
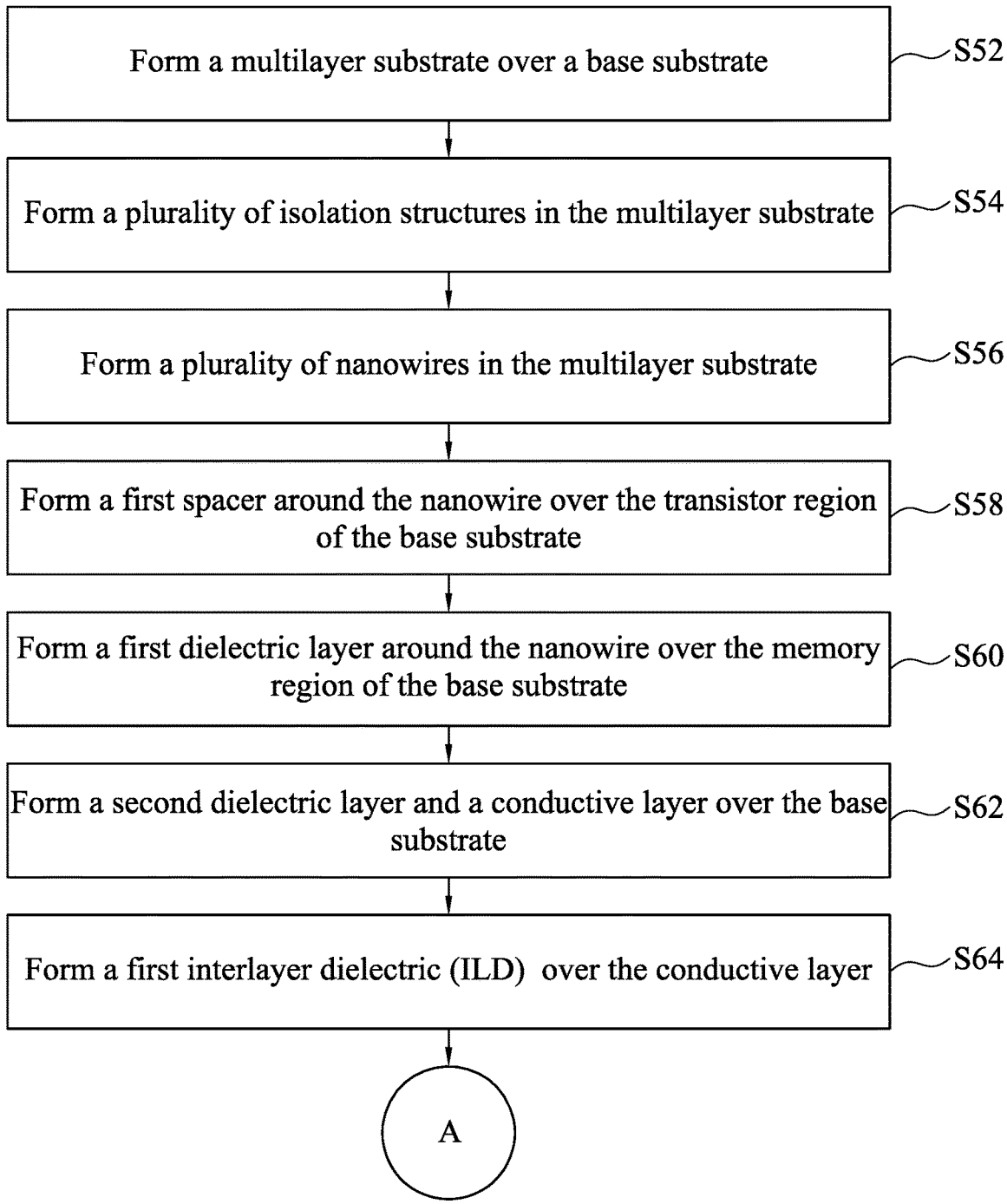
FIGS. 11A and 11B are a flowchart of a method for making a memory device according to aspects of the present disclosure in various embodiments.
Figure 11B:
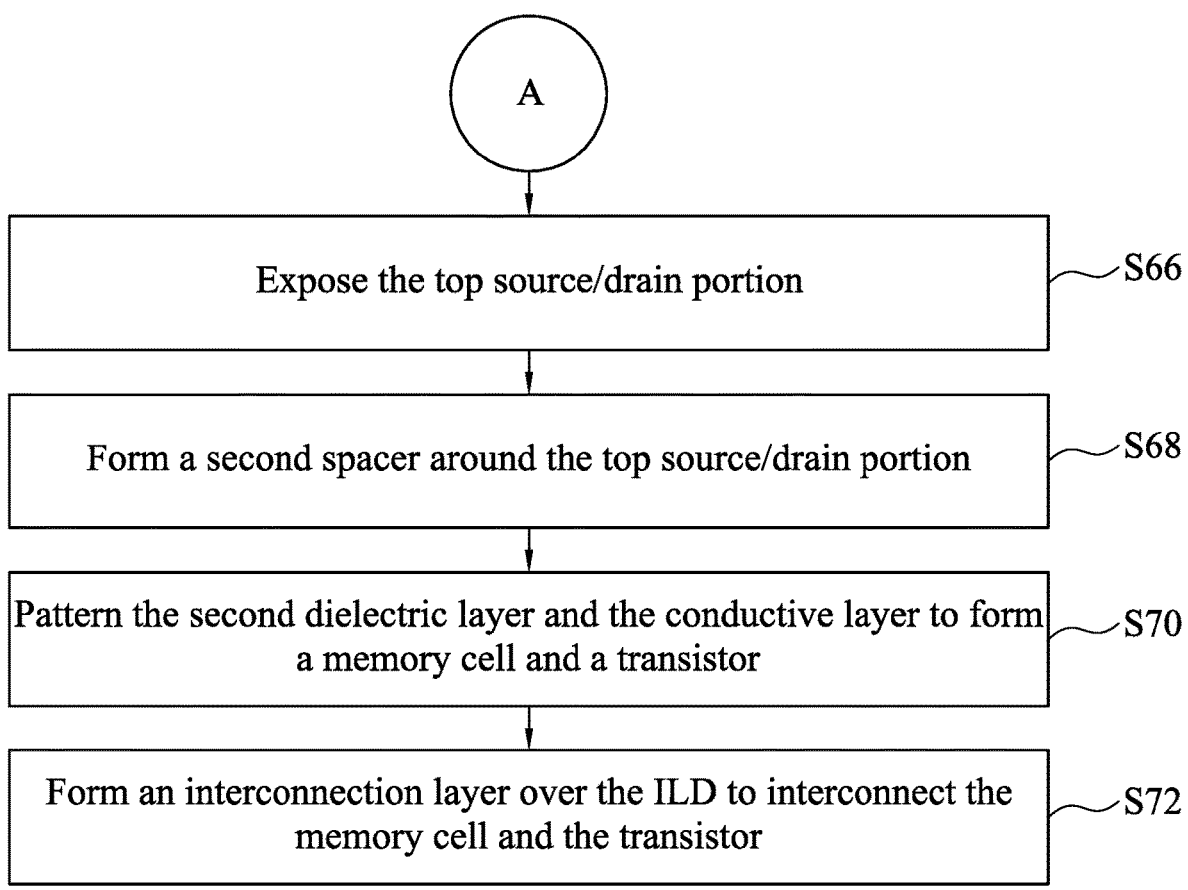
Figure 12E:
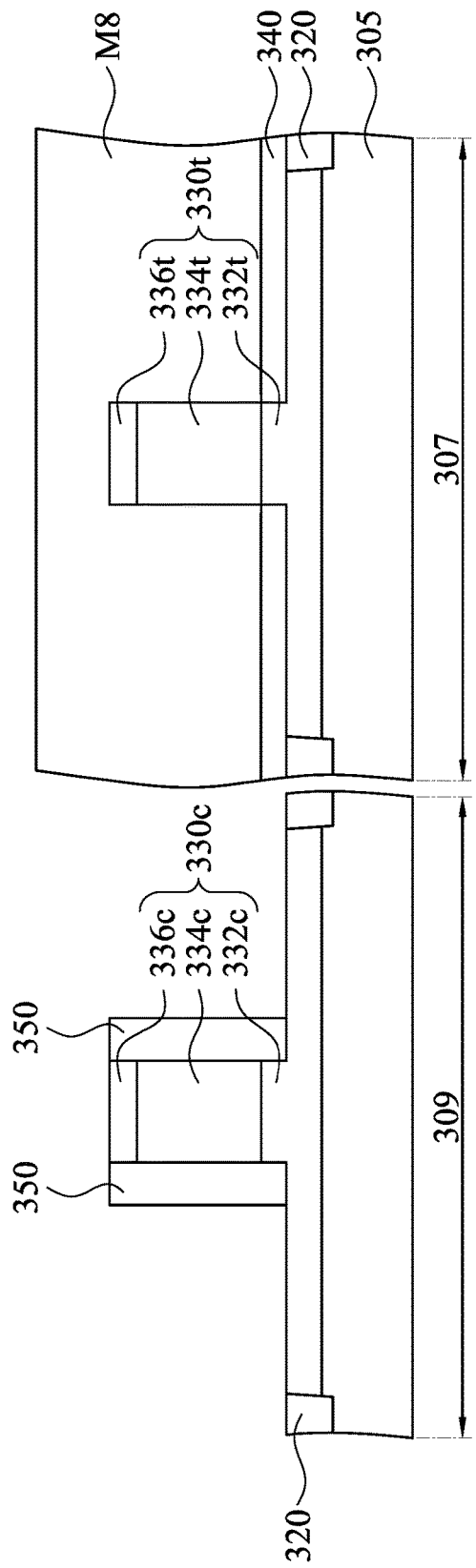

FIGS. 11A and 11B are a flowchart of a method M50 for making a memory device according to aspects of the present disclosure in various embodiments. Various operations of the method M50 are discussed in association with cross-section diagrams FIGS. 12A-12L. Throughout the various views and illustrative embodiments, like reference numbers are used to designate like elements. In operation S52 of method M50, a multilayer substrate 310 is formed over a base substrate 305, as shown in FIG. 12A. The multilayer substrate 310 includes various substrate layers 312, 314, and 316. The substrate layer 312 may be a high-dopant region (e.g., having a concentration of n-type or p-type dopants of about $1 \times 10^{20}$ cm$^{-3}$ to about $1 \times 10^{22}$ cm$^{-3}$ or even greater) of the base substrate 305. Alternatively, the substrate layer 312 may be formed over the base substrate 305 using an epitaxy process, such as metal-organic (MO) chemical vapor deposition (CVD), molecular beam epitaxy (MBE), liquid phase epitaxy (LPE), vapor phase epitaxy (VPE), selective epitaxial growth (SEG), combinations thereof, and the like.

The base substrate 305 has a transistor region 307 and a memory region 309 and may be a semiconductor substrate, such as a bulk semiconductor, a semiconductor-on-insulator (SOI) substrate, or the like, which may be doped (e.g., with a p-type or an n-type dopant) or undoped. In some embodiments, an SOI substrate includes a layer of a semiconductor material formed on an insulator layer. The insulator layer may be, for example, a buried oxide (BOX) layer, a silicon oxide layer, or the like. The insulator layer is provided on a substrate, e.g., a silicon or glass substrate. Other substrates, such as a multi-layered or gradient substrate may also be used. In some embodiments, the semiconductor material of the base substrate 305 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate layers 314 and 316 may be formed over the substrate layer 312. In some embodiments, various epitaxies may be performed to form various substrate layers 312, 314, and/or 316. Any suitable epitaxy processes may be used, such as by MO CVD, MBE, LPE, VPE, SEG, combinations thereof, or the like. The substrate layer 314 may be a lightly-doped or undoped layer (e.g., having a dopant concentration less than about $1 \times 10^{18}$ cm$^{-3}$) whereas the substrate layer 316 may be highly-doped (e.g., having a dopant concentration of about $1 \times 10^{20}$ cm$^{-3}$ to about $1 \times 10^{22}$ cm$^{-3}$ or even greater). Furthermore, the substrate layer 314 may be doped with dopant of a different type than the substrate layers 312 and/or 316. The implantation of dopants in the substrate layers 312, 314, and 316 may be achieved using any suitable method.

In operation S54 of method M50, a plurality of isolation structures 320 are formed in the multilayer substrate 310, as shown in FIG. 12B. In some embodiments, the isolation structures 320 may be formed by patterning openings in the multilayer substrate 310 and filling the openings with a dielectric material. For example, a hard mask and/or photoresist (not illustrated) may be disposed over the multilayer substrate 310. The hard mask may include one or more oxide (e.g., silicon oxide) and/or nitride (e.g., silicon nitride) layers to prevent damage to the underlying multilayer substrate 310 during patterning, and the hard mask may be formed using any suitable deposition process, such as, atomic layer deposition (ALD), CVD, high density plasma CVD (HDP-CVD), physical vapor deposition (PVD), and the like. In some embodiments, the isolation structures 320 and 120 (see FIG. 2M) may have the same or similar material.

In operation S56 of method M50, a plurality of nanowires (or nano-rods or nano-columns) 330t and 330c are formed in the multilayer substrate 310, as shown in FIG. 12C. The nanowire 330t is formed over the transistor region 307 of the base substrate 305, and the nanowire 330c is formed over the memory region 309 of the base substrate 305. More specifically, the multilayer substrate 310 and the isolation structures 320 are further patterned to form the nanowires 330t and 330c. The patterning of the nanowires 330t and 330c may be done using a combination of photolithography and etching as described above, for example. The nanowire 330t includes a bottom highly-doped semiconductor portion (i.e., a bottom source/drain portion) 332t, a middle lightly-doped or undoped semiconductor portion (i.e., a channel portion) 334t, and a top highly-doped semiconductor portion (i.e., a top source/drain portion) 336t, and the nanowire 330c includes a bottom highly-doped semiconductor portion 332c, a middle lightly-doped or undoped semiconductor portion 334c, and a top highly-doped semiconductor portion 336c. The portions 332t (332c), 334t (334c), and 336t (336c) correspond to the substrate layers 312, 314, and 316, respectively. In the VGAA transistor T (see e.g., FIG. 12L), the portion 332t is a bottom source/drain portion, the portion 334t is a channel portion, and the portion 336t is a top source/drain portion. In the memory cell C (see e.g., FIG. 12L), the portions 332c, 334c, and 336c are the bottom electrode of the memory cell C.

In operation S58 of method M50, a first spacer 340 is formed around the nanowire 330t over the transistor region 307 of the base substrate 305, as shown in FIG. 12D. The first spacer 340 may also be formed over the isolation structure 320. A top surface of the first spacer 340 may be substantially level with or higher than a top surface of source/drain portion 332t in the nanowire 330t. In some embodiments, the first spacer 340 may include a dielectric material, such as silicon nitride, for example, formed using any suitable process, such as, CVD, PVD, ALD, and the like. In some embodiments, a mask M7 may be formed to cover the memory region 309 of the base substrate 305. The deposition of the first spacer 340 may be a conformal process, and an etch back process may be performed to remove excess portions of the first spacer 340 from sidewalls of the top source/drain portion 336t, sidewalls of the channel portion 334t, and a top surface of the nanowire 330t. In the (VGAA) transistor T (see e.g., FIG. 12L), the first spacer 340 may be used to prevent a gate stack G from contacting the bottom source/drain portion 332t.

In operation S60 of method M50, a first dielectric layer 350 is formed around the nanowire 330c over the memory region 309 of the base substrate 305, as shown in FIG. 12E. A top surface of the first dielectric layer 350 may be substantially level with a top surface of the portion 336c in the nanowire 330c. In some embodiments, the first dielectric layer 350 may have the same or similar materials to the ILD 170 (see FIG. 2M), for example, formed using any suitable process, such as, CVD, PVD, ALD, and the like. In some embodiments, the mask M7 (see FIG. 12D) is removed after the first spacer 340 is formed, and another mask M8 may be formed to cover the transistor region 307 of the base substrate 305. The deposition of the first dielectric layer 350 may be a conformal process, and an etch back and then a patterning process may be sequentially performed to remove excess portions of the first dielectric layer 350 from the top surface of the portion 336c and over the isolation structure 320.

Figure 12F:
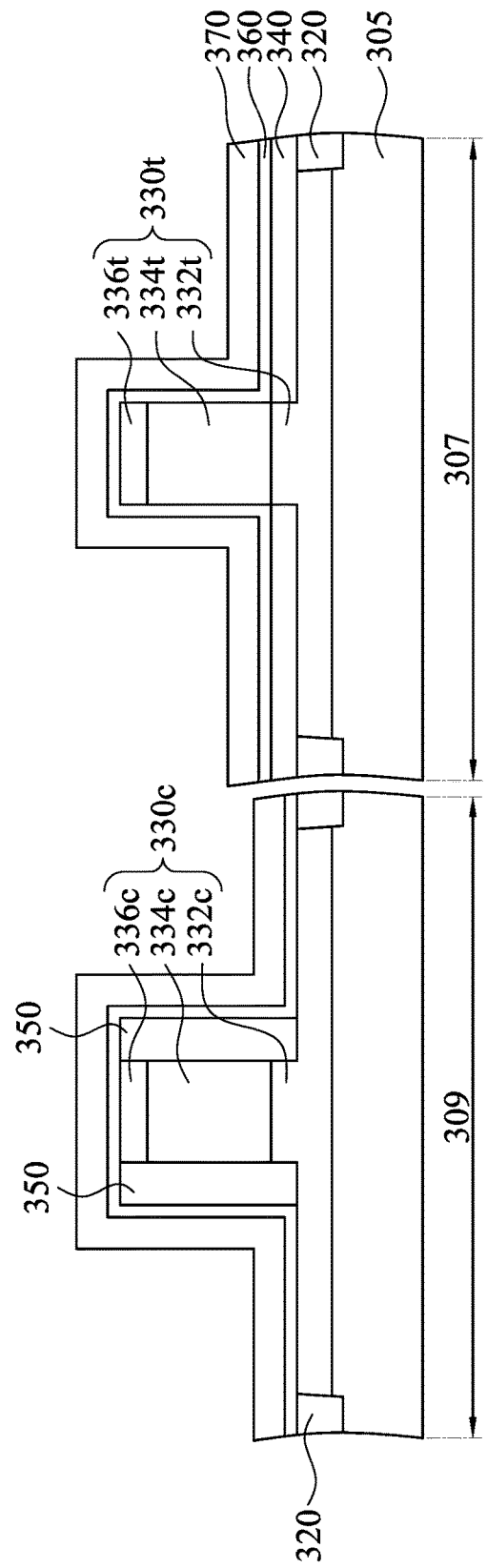

In operation S62 of method M50, a second dielectric layer 360 and a conductive layer 370 are subsequently formed over the base substrate 305, as shown in FIG. 12F. The mask M8 in FIG. 12E is removed, and then the second dielectric layer 360 and the conductive layer 370 are formed over the base substrate 305. The second dielectric layer 360 and the conductive layer 370 may encircle all sides of the portions 334c and 334t. In some embodiments, the second dielectric layer 360 includes silicon oxide, silicon nitride, or multi-layers thereof. Additionally or alternatively, the second dielectric layer 360 may include a high-k dielectric material. In such embodiments, the second dielectric layer 360 may have a k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of the second dielectric layer 360 may include molecular beam deposition (MBD), ALD, PECVD, and the like. The conductive layer 370 is formed over the second dielectric layer 360 using a suitable deposition process such as MBD, ALD, PECVD, and the like. The conductive layer 370 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like.

In operation S64 of method M50, a first interlayer dielectric (ILD) 380 is formed over the conductive layer 370, as shown in FIG. 12G. The first ILD 380 may include a low-k dielectric having a k-value less than about 3.9, such as about 2.8 or even less. In some embodiments, the first ILD 380 includes a flowable oxide formed using, for example, flowable chemical vapor deposition (FCVD). In some embodiments, the first ILD 380 may also include a protection layer (not separately illustrated) beneath the flowable oxide, the materials of such protection layer include SiN, SiON, and the like. In some embodiments, the first ILD 380 may be used as a planarization layer to provide a level top surface for subsequent processing. Thus, a CMP (or other suitable planarization process) may be performed to level the top surfaces of the first ILD 380 and the conductive layer 370.

In operation S66 of method M50, the top source/drain portion 336t is exposed, as shown in FIG. 12H. In some embodiments, another mask M9 is formed over the memory region 309 of the base substrate 305, and an etch back process is performed to pattern the first ILD 380, the conductive layer 370, and the second dielectric layer 360 over the transistor region 307. As such, the top source/drain portion 336t is exposed as shown in FIG. 12H. Thus, in the resulting structure, the conductive layer 370 and the second dielectric layer 360 may only be disposed on sidewalls of the channel portion 334t, and the conductive layer 370 and the second dielectric layer 360 may not share interfaces with the source/drain regions 336t and/or 332t.

Figure 12I:
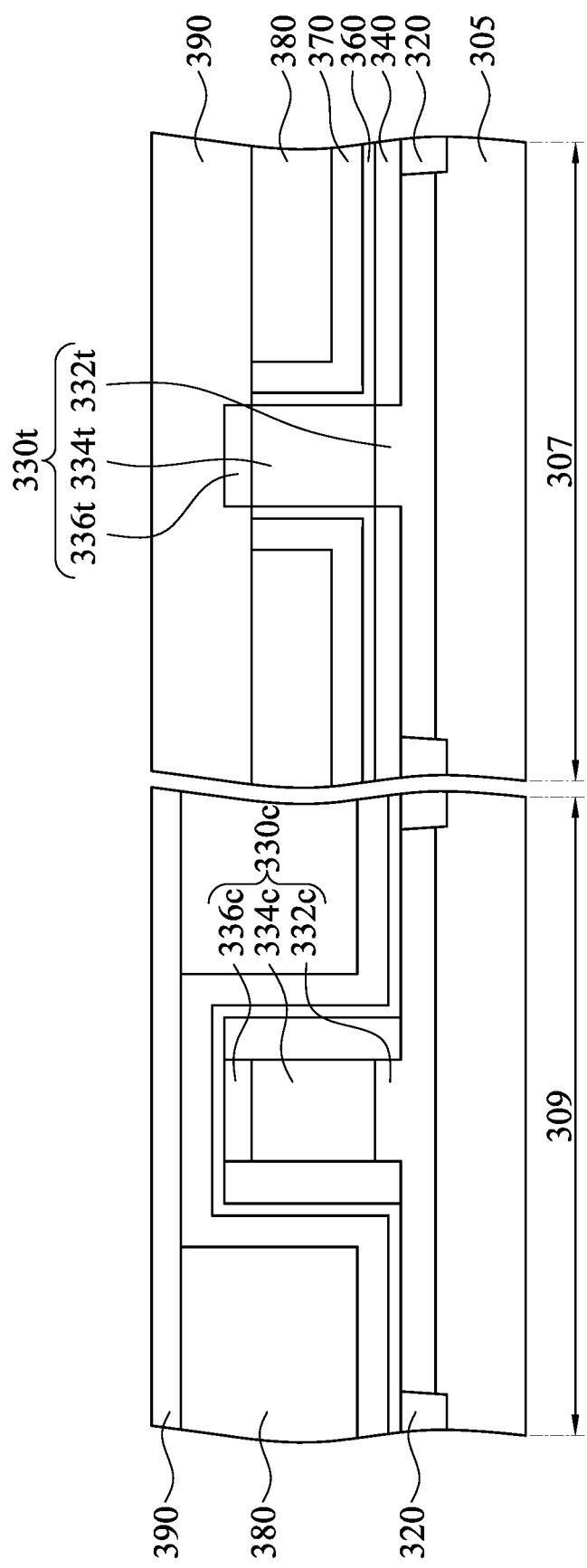

In operation S68 of method M50, a second spacer 390 is formed around the top source/drain portion 336t of the nanowire 330t, as shown in FIG. 12I. The mask M9 in FIG. 12H is removed in advance. In some embodiments, the second spacer 390 may include a similar material as the first spacer 340 (e.g., silicon nitride). The second spacer 390 may be formed as a blanket layer. The second spacer 390 may cover a top surface of the top source/drain portion 336t.

Figure 12J:
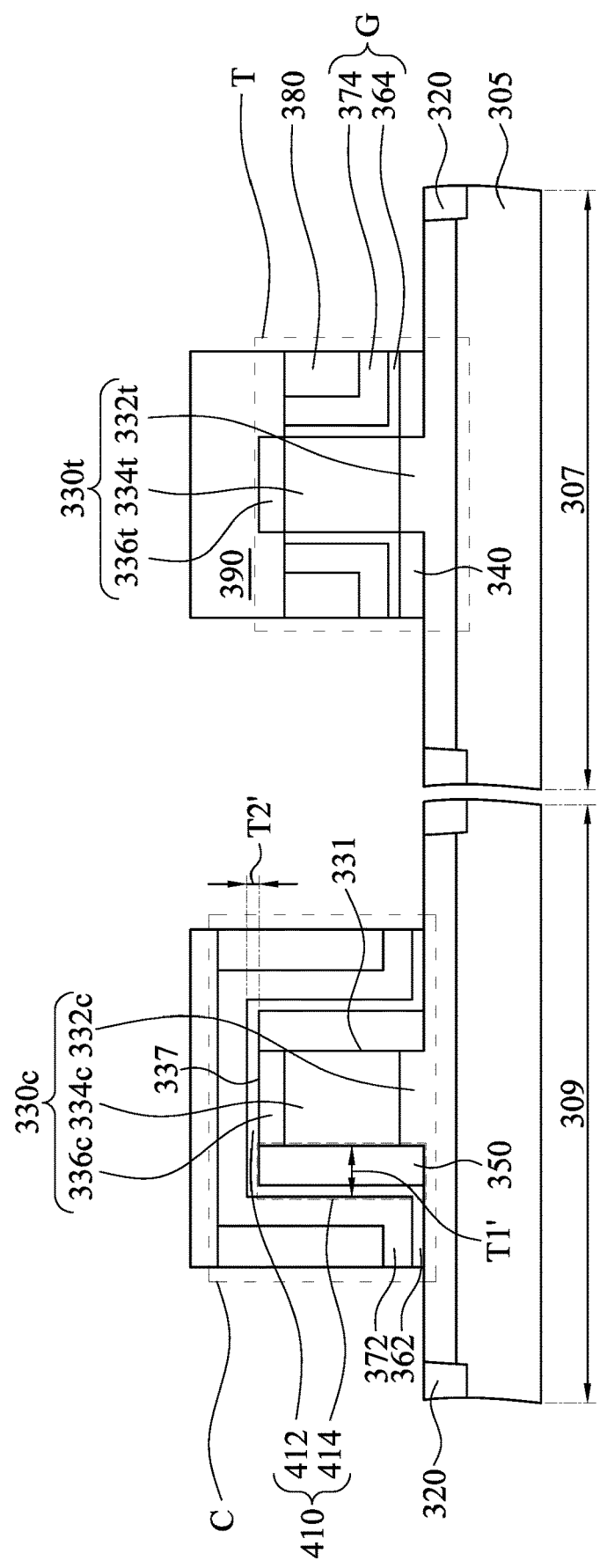

In operation S70 of method M50, the second dielectric layer 360 and the conductive layer 370 are patterned to form a memory cell C and a transistor T, as shown in FIG. 12J. In some embodiments, another mask (not shown) is formed over the structure of FIG. 12I, and a patterning process is performed to pattern the second dielectric layer 360 and the conductive layer 370. In FIG. 12J, the patterned second dielectric layer 362 and the first dielectric layer 350 form a dielectric structure 410, which includes a thin portion 412 over the portion 336c and a thick portion 414 on sidewalls 331 of the nanowire 330c. In other words, the thin portion 412 is in contact with a top surface 337 of the portion 336c, and the thick portion 414 is in contact with the sidewalls 331 of the nanowire 330c. The thin portion 412 has an EOT T2' less than an EOT T1' of the thick portion 414. The patterned conductive layer 372 is a top electrode of the memory cell C. In other words, the memory cell C includes a bottom electrode (the nanowire 330c), a dielectric structure 410, and a top electrode (the patterned conductive layer 372). On the other hand, the patterned dielectric layer 364 and the patterned conductive layer 374 form a gate stack G. Further, the nanowire 330t and the metal gate stack G form a (VGAA) transistor T.

Figure 12K:
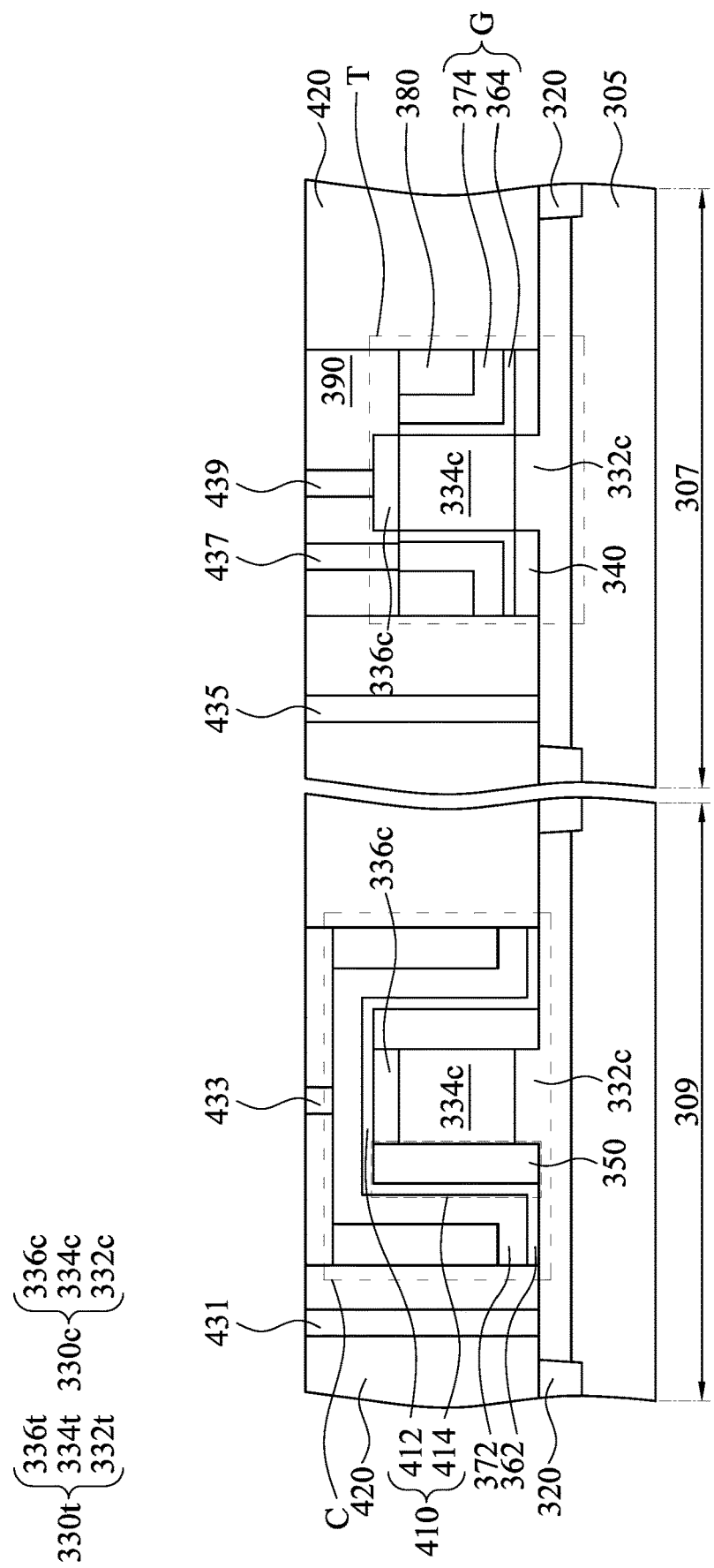
Figure 12L:
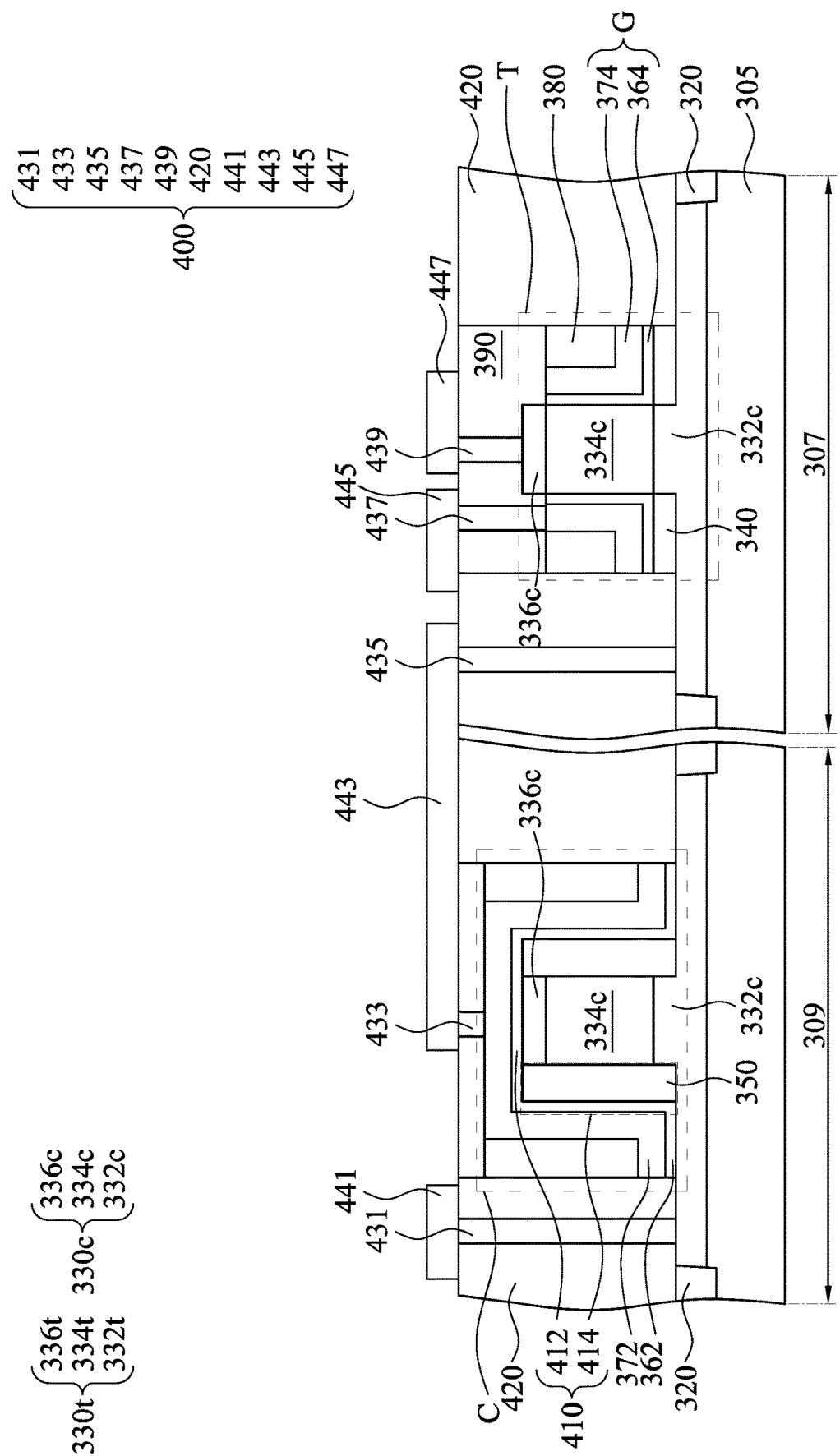

In operation S72 of method M50, an interconnect layer 400 is formed over the first ILD 380 to interconnect the memory cell C and the transistor T, as shown in FIGS. 12K and 12L. Reference is made to FIG. 12K. A second ILD 420 is formed over the base substrate 305. In some embodiments, the ILDs 420 and 170 (see FIG. 2M) may have the same or similar material. Then, a plurality of contacts 431, 433, 435, 437, and 439 are formed in the second ILD 420. The contact 431 is in contact with the substrate 312 (and electrically connected to the bottom electrode 330c of the memory cell C), the contact 433 is in contact with the top electrode 382 of the memory cell C, the contact 435 is in contact with the substrate 312 (and electrically connected to the bottom source/drain portion 332c of the transistor T), the contact 437 is in contact with the metal gate stack G of the transistor T, and the contact 439 is in contact with the top source/drain portion 336t of the transistor T.

Referring to FIG. 12L, a plurality of conductive lines 441, 443, 445, and 447 are formed on the first ILD 380 and the second ILD 420. The conductive line 441 is in contact with the contact 431 and serves as a terminal of the memory cell C. The conductive line 441 may be grounded in some embodiments. The conductive line 443 is in contact with the contacts 433 and 435 to interconnect the top electrode 382 of the memory cell C and the drain of the transistor T. The conductive line 445 is in contact with the contact 437 and serves as a terminal of the transistor T, and the conductive line 445 may be a word line. The conductive line 447 is in contact with the contact 439 and serves as another terminal of the transistor T, and the conductive line 447 may be a bit line.

It is noted that the formation of the interconnect layer 400 in FIGS. 12K and 12L is an example, and should not limit the present disclosure. In some other embodiments, the formation of the interconnect layer 400 includes damascene process. That is, the conductive lines and contacts are formed together. In some other embodiments, the memory cell C and the transistor T may be formed separately. For example, the memory cell C may be formed before or after the transistor T.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the memory device has a good and stable memory window with a simple structure. Another advantage is that the memory window can be controlled by tuning the area ratio of the top electrode. Furthermore, the memory device has a retention time long enough that is qualified for embedded DRAM application. Moreover, the memory cells can be fabricated with transistors, which may simplify the fabrication process and reduce the fabrication costs.

According to some embodiments, a memory device includes a transistor and a memory cell. The memory cell includes a bottom electrode, a top electrode, and a dielectric structure. The top electrode is electrically connected to the transistor. The dielectric structure includes a thin portion and a thick portion. The thin portion is sandwiched between the bottom electrode and the top electrode. The thick portion is thicker than the thin portion and between the bottom electrode and the top electrode.

According to some embodiments, a memory device includes a transistor and a memory cell. The memory cell includes a bottom electrode, a dielectric structure, and a top electrode. The bottom electrode is electrically connected to the transistor. The bottom electrode is a nanowire. The dielectric structure covers the nanowire. The dielectric structure includes a thin portion in contact with a top surface of the nanowire and a thick portion in contact with a sidewall of the nanowire. The top electrode is over the dielectric structure.

According to some embodiments, a method for manufacturing a memory device includes forming a transistor over a transistor region of the substrate. A memory cell is formed over a memory region of the substrate. An interconnect layer is formed over the transistor and the memory cell to interconnect the transistor and the memory cell. Forming the memory cell includes forming a bottom electrode in the substrate. A dielectric structure is formed on the bottom electrode. The dielectric structure includes a thin portion and a thick portion thicker than the thin portion. A top electrode is formed over the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device comprising:
a transistor comprising a gate electrode and source/drain epitaxy structures on opposite sides of the gate electrode; and
a memory cell comprising:
a bottom electrode;
a top electrode electrically connected to the transistor, wherein a bottommost surface of the top electrode is lower than a topmost surface of the gate electrode and higher than a bottommost surface of the gate electrode;
an isolation structure directly between the bottom electrode of the memory device and the source/drain epitaxy structures of the transistor, wherein a top- most surface of the isolation structure is lower than a topmost surface of the bottom electrode; and a dielectric structure comprising:
- a thin portion sandwiched between the bottom electrode and the top electrode; and
- a thick portion thicker than the thin portion and between the bottom electrode and the top electrode, wherein a topmost surface of the thick portion of the dielectric structure is not lower than the topmost surface of the gate electrode of the transistor, and the topmost surface of the bottom electrode is lower than the topmost surface of the gate electrode of the transistor.

2. The memory device of claim 1, wherein the bottom electrode of the memory cell and a channel of the transistor have the same materials.

3. The memory device of claim 1, wherein the top electrode comprises:
- a bottom portion in contact with the thin portion of the dielectric structure and surrounded by the thick portion of the dielectric structure; and
- a top portion over the bottom portion of the top electrode and the thick portion of the dielectric structure.

4. The memory device of claim 3, wherein the thin portion of the dielectric structure is in direct physical contact with the top electrode and the bottom electrode.

5. The memory device of claim 3, wherein the thick portion of the dielectric structure is in contact with the bottom electrode.

6. The memory device of claim 1, wherein the thick portion and the thin portion of the dielectric structure are made of different materials.

7. The memory device of claim 1, further comprising an interlayer dielectric (ILD) surrounding the gate electrode of the transistor, and the ILD and the thick portion of the dielectric structure have the same materials.

8. The memory device of claim 7, further comprising a contact etch stop layer between the ILD and the gate electrode.

9. The memory device of claim 1, wherein the top electrode of the memory cell is spaced apart from the source/drain epitaxy structures of the transistor.

10. The memory device of claim 9, wherein the bottommost surface of the top electrode is higher than a topmost surface of one of the source/drain epitaxy structures.

11. The memory device of claim 9, wherein a bottommost surface of the thin portion of the dielectric structure is higher than bottommost surfaces of the source/drain epitaxy structures.

12. The memory device of claim 1, wherein the isolation structure is in direct physical contact with the bottom electrode of the memory device and one of the source/drain epitaxy structures of the transistor.

13. The memory device of claim 1, wherein a bottommost surface of the thin portion of the dielectric structure is substantially coplanar with a bottommost surface of the thick portion of the dielectric structure.

14. The memory device of claim 1, wherein a topmost surface of the top electrode is higher than the topmost surface of the gate electrode.

15. The memory device of claim 1, wherein the topmost surface of the isolation structure is lower than a topmost surface of one of the source/drain epitaxy structures.

16. A memory device comprising:
a transistor; and
a memory cell comprising:
- a bottom electrode electrically connected to the transistor, wherein the bottom electrode is a semiconductive nanowire, and the bottom electrode comprises:
  - a top portion;
  - a bottom portion; and
  - a middle portion between the top portion and the bottom portion, wherein both a dopant concentration of the top portion and a dopant concentration of the bottom portion are higher than a dopant concentration of the middle portion;
- a dielectric structure covering the semiconductive nanowire, wherein the dielectric structure comprises a thin portion in contact with a top surface of the semiconductive nanowire and a thick portion in contact with a sidewall of the semiconductive nanowire, the thin portion is thinner than the thick portion, and a top surface of the thin portion of the dielectric structure is higher than a top surface of the thick portion of the dielectric structure; and
- a top electrode over the dielectric structure.

17. The memory device of claim 16, wherein the transistor comprises a gate structure and a channel directly below the gate structure, and the middle portion of the semiconductive nanowire and the channel of the transistor have the same material.

18. A method for manufacturing a memory device, the method comprising:
forming a memory cell over a memory region of a substrate, comprising:
- forming a bottom electrode in the substrate;
- forming a dielectric structure on the bottom electrode, wherein the dielectric structure comprises a thin portion and a thick portion thicker than the thin portion, and forming the dielectric structure comprises:
  - forming an interlayer dielectric (ILD) over the bottom electrode; and
  - removing a portion of the ILD to form a recess in the ILD, such that the thick portion of the dielectric structure laterally surrounds the recess; and
- forming a top electrode over the dielectric structure and partially in the recess of the ILD such that the top electrode is in direct physical contact with the ILD at a sidewall of the recess;

forming a transistor over a transistor region of the substrate and comprising forming a gate structure of the transistor over the substrate after forming the bottom electrode of the memory cell; and forming an interconnect layer over the transistor and the memory cell to interconnect the transistor and the memory cell.

19. The method of claim 18, wherein forming the transistor comprises forming a channel in the substrate, and forming the channel of the transistor and forming the bottom electrode are performed using one patterning process.

20. The method of claim 18, wherein the recess of the ILD does not expose the bottom electrode.

* * * * *